United States Patent
Iriguchi

(10) Patent No.: US 7,535,294 B2
(45) Date of Patent: May 19, 2009

(54) OFFSET CANCELLATION AMPLIFIER, DISPLAY EMPLOYING THE OFFSET CANCELLATION AMPLIFIER AND METHOD FOR CONTROLLING THE OFFSET CANCELLATION AMPLIFIER

(75) Inventor: Masao Iriguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 167 days.

(21) Appl. No.: 11/709,409

(22) Filed: Feb. 22, 2007

(65) Prior Publication Data

US 2007/0200620 A1    Aug. 30, 2007

(30) Foreign Application Priority Data

Feb. 24, 2006  (JP)  ............................. 2006-048649

(51) Int. Cl.
    *H03F 1/02*   (2006.01)
(52) U.S. Cl. ............................................. 330/9
(58) Field of Classification Search ................ None
    See application file for complete search history.

(56) References Cited

U.S. PATENT DOCUMENTS

| 4,306,196 | A * | 12/1981 | Dwarakanath et al. ......... 330/9 |
| 4,322,687 | A * | 3/1982 | Dwarakanath et al. ......... 330/9 |
| 4,365,204 | A * | 12/1982 | Haque ........................ 327/337 |
| 6,087,897 | A * | 7/2000 | Wang .......................... 330/9 |
| 6,169,440 | B1 * | 1/2001 | Liu ............................. 327/337 |
| 6,448,836 | B2 * | 9/2002 | Kokubun et al. ............. 327/307 |
| 6,586,990 | B2 * | 7/2003 | Udo et al. ..................... 330/9 |
| 6,911,858 | B2 * | 6/2005 | Mori ........................... 327/307 |
| 6,946,905 | B2 * | 9/2005 | Kokubun et al. ............. 330/9 |
| 7,081,792 | B2 * | 7/2006 | Kasai et al. .................. 330/9 |
| 7,336,124 | B2 * | 2/2008 | Kasai et al. .................. 330/9 |
| 7,358,946 | B2 * | 4/2008 | Kokubun et al. ............. 345/87 |
| 7,368,983 | B2 * | 5/2008 | Nishimori ..................... 330/9 |
| 2006/0244710 | A1 * | 11/2006 | Iriguchi et al. .............. 345/100 |

FOREIGN PATENT DOCUMENTS

| JP | 2001-292041 | 10/2001 |
| JP | 2003-168936 | 6/2003 |
| JP | 2005-117547 | 4/2005 |

OTHER PUBLICATIONS

Kuroda, et al.,"Design and Application of Analog CMOS Integrated Circuit," pp. 508-515, Maruzen, 2003.

* cited by examiner

*Primary Examiner*—Benny Lee
*Assistant Examiner*—Krista M Flanagan
(74) *Attorney, Agent, or Firm*—Scully, Scott, Murphy & Presser, P.C.

(57) ABSTRACT

An offset cancellation amplifier where during a first period of a data output period, an output voltage and a reference voltage are supplied to the gates of a first differential pair, and the output voltage is accumulated in first and second capacitors while an input voltage is supplied in common to the gates of a second differential pair. During a second period, the output voltage is accumulated in the first capacitor, while the reference voltage is accumulated in the second capacitor. During a third period, the gates of the first differential pair cease to be supplied with the output voltage and with the reference voltage, respectively, and are supplied with the voltages accumulated in the first and second capacitors, respectively. The gates of the second differential pair are supplied with the output voltage and with the input voltage, respectively.

24 Claims, 12 Drawing Sheets

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
VREF; REFERENCE VOLTAGE SUPPLY TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 1

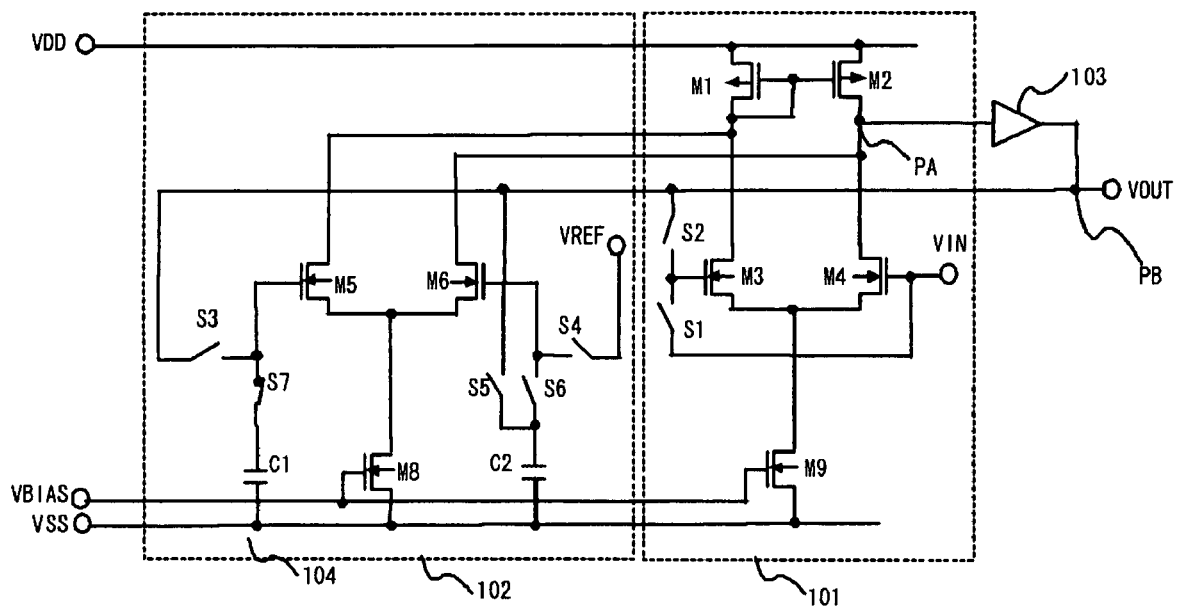

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
VREF; REFERENCE VOLTAGE SUPPLY TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 2

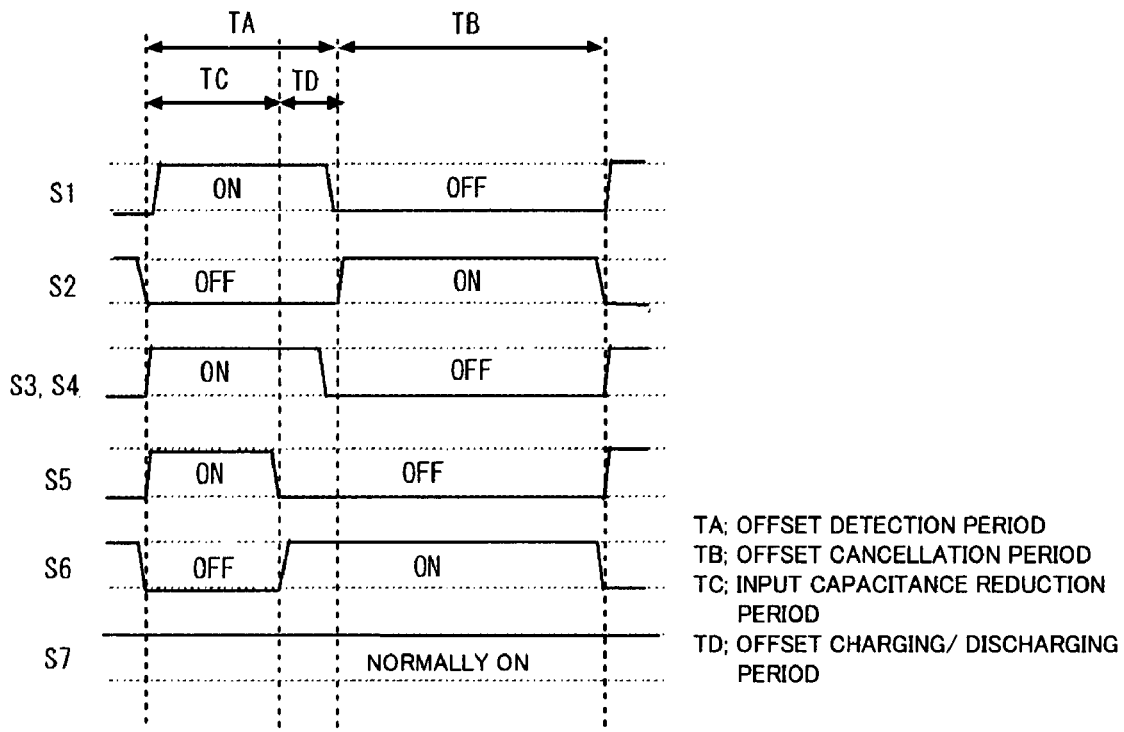

TA; OFFSET DETECTION PERIOD
TB; OFFSET CANCELLATION PERIOD
TC; INPUT CAPACITANCE REDUCTION PERIOD
TD; OFFSET CHARGING/ DISCHARGING PERIOD

FIG. 3

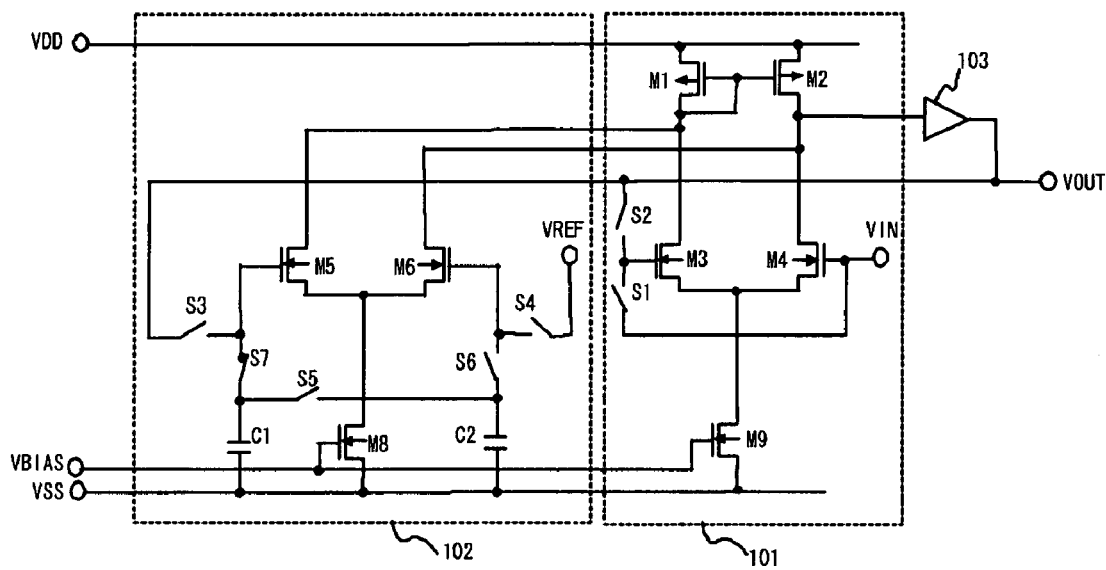

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
VREF; REFERENCE VOLTAGE SUPPLY TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 4

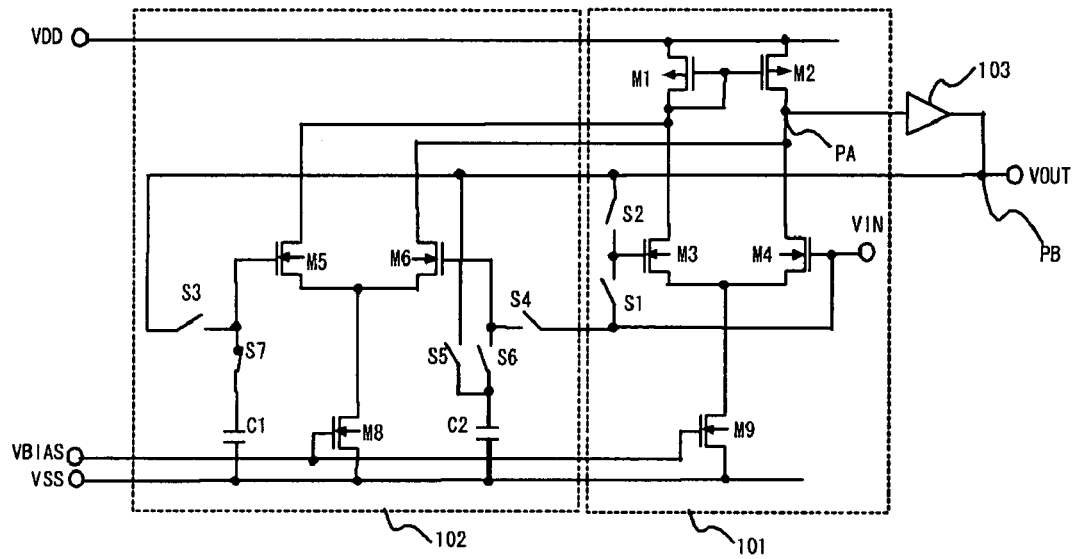

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 5

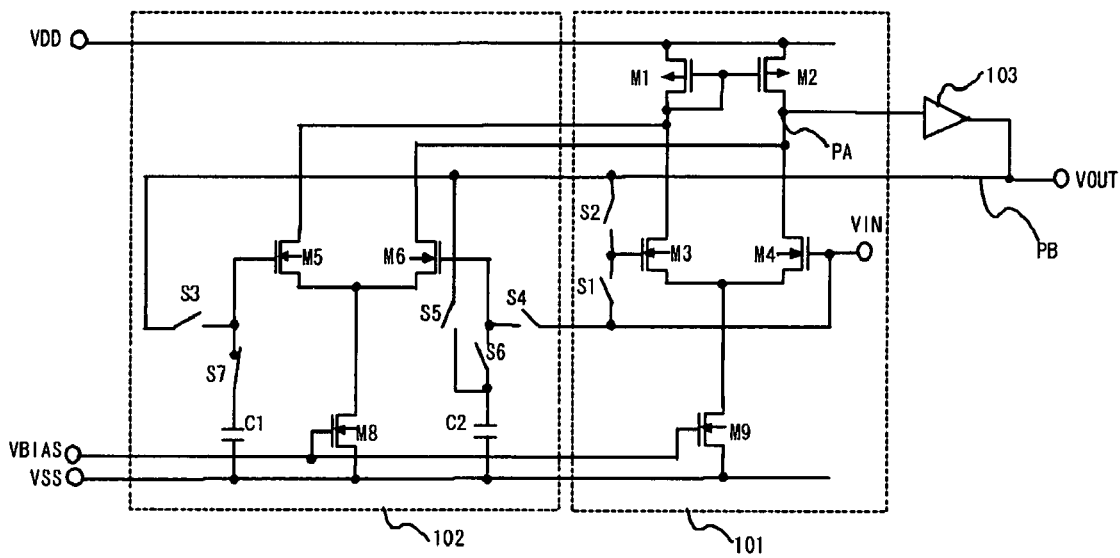

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 6

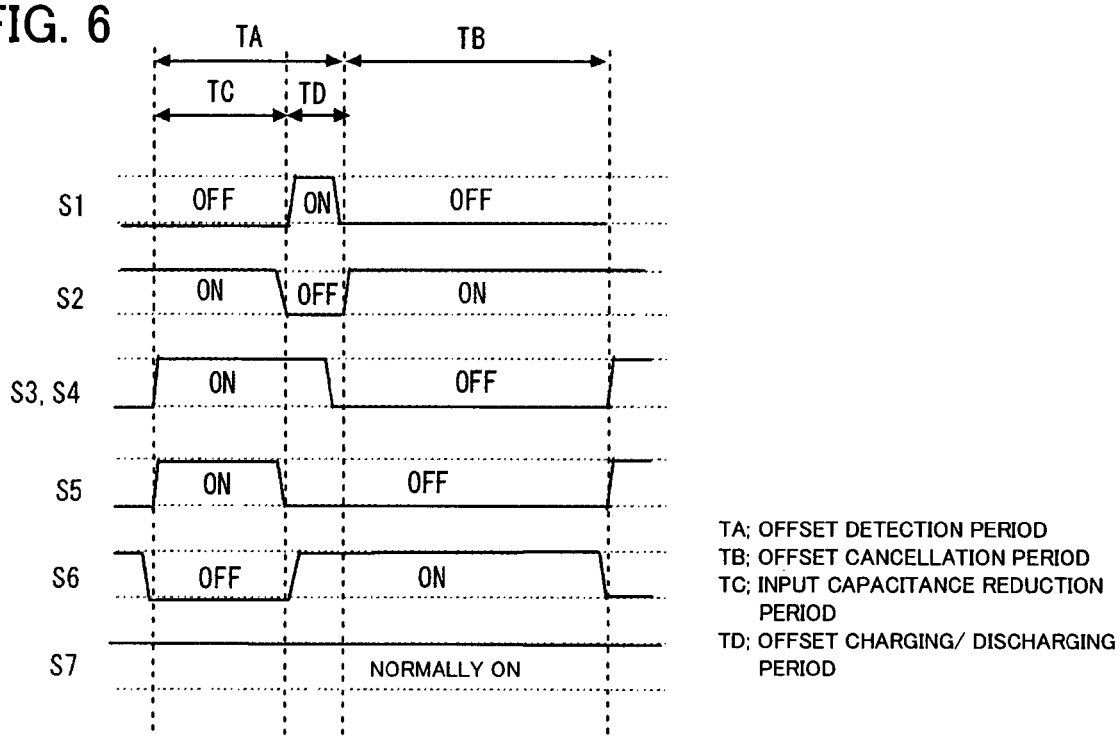

TA; OFFSET DETECTION PERIOD
TB; OFFSET CANCELLATION PERIOD
TC; INPUT CAPACITANCE REDUCTION PERIOD
TD; OFFSET CHARGING/ DISCHARGING PERIOD

FIG. 7

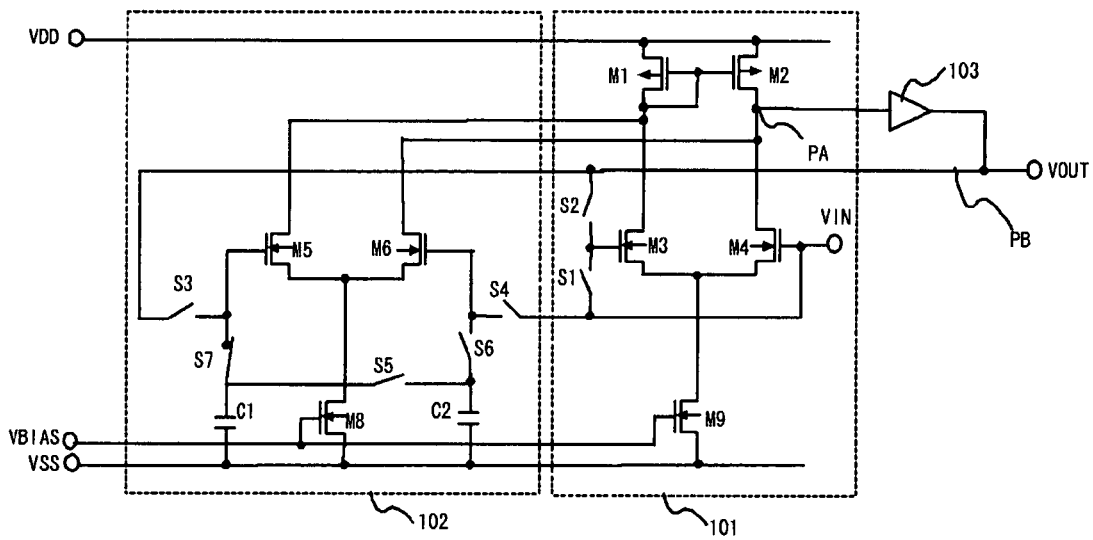

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 8

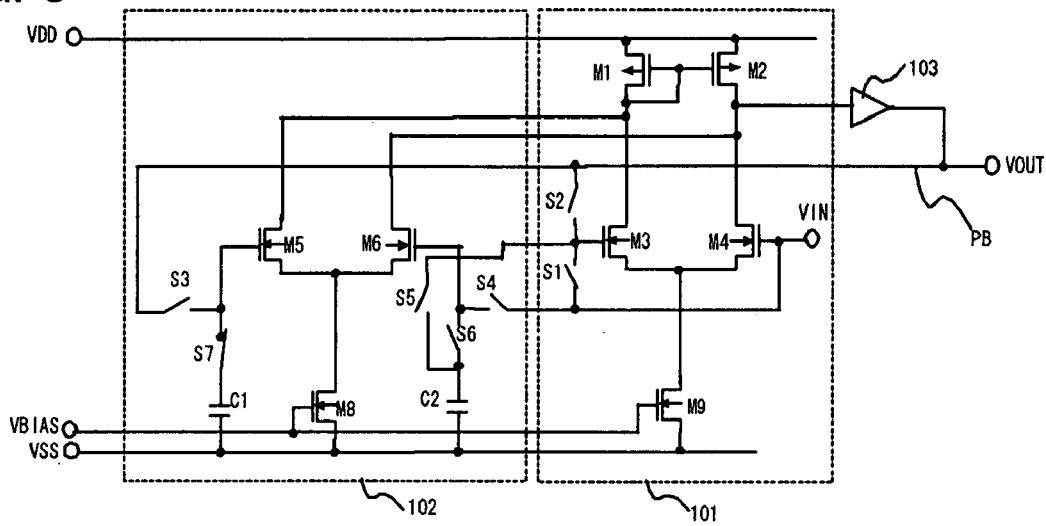

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1 to S7; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 9

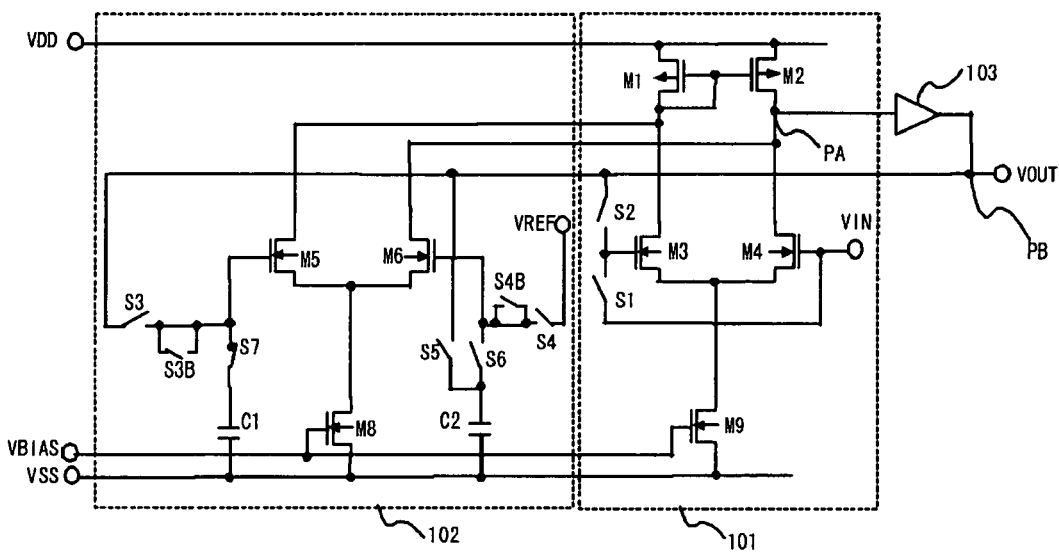

101; DIFFERENTIAL CIRCUIT
102; OFFSET CANCELLATION CIRCUIT
103; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1 to S7, S3B, S4B; SWITCHES
C1, C2; CAPACITORS
M1 to M9; TRANSISTORS
PA; DIFFERENTIAL AMPLIFIER CIRCUIT OUTPUT
PB; OUTPUT STAGE AMPLIFIER CIRCUIT OUTPUT

FIG. 10A

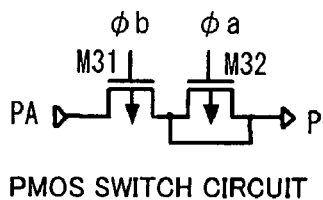

PMOS SWITCH CIRCUIT

FIG. 10B

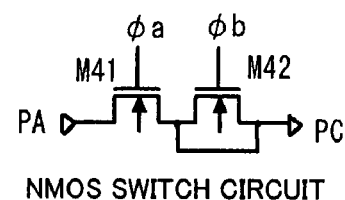

NMOS SWITCH CIRCUIT

FIG. 10C

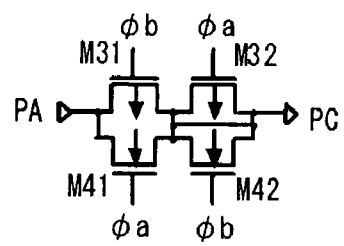

CMOS SWITCH CIRCUIT

M31, M32; PMOS TRANSISTORS
M41, M42; NMOS TRANSISTORS
Φa, Φb; SWITCH CONTROL CLOCKS

PA; DIFFERENTIAL AMPLIFIER CIRCUIT OUTPUT
PC; CAPACITOR END NODE

FIG. 11

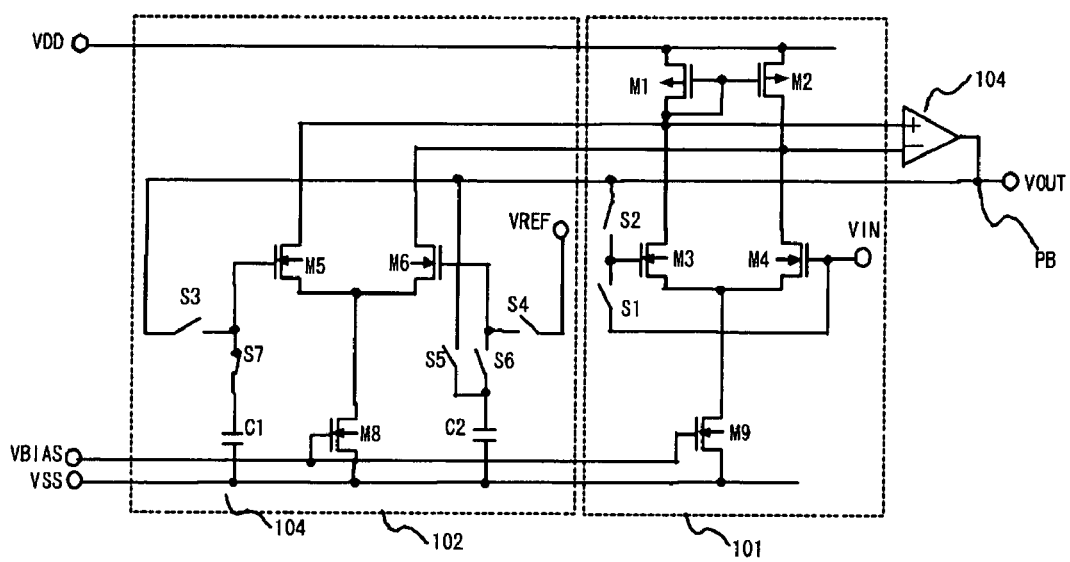

101; DIFFERENTIAL CIRCUIT
102; OFFSET CANCELLATION CIRCUIT
104; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL

VSS; GROUND TERMINAL
VREF; REFERENCE VOLTAGE SUPPLY TERMINAL
S1 to S7; SWITCHES
C1, C2; CAPACITORS
M1 to M9; TRANSISTORS
PB; OUTPUT STAGE AMPLIFIER CIRCUIT OUTPUT

101; DIFFERENTIAL CIRCUIT
102; OFFSET CANCELLATION CIRCUIT
103, 203; OUTPUT STAGE AMPLIFIER CIRCUIT
VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
VREF; REFERENCE VOLTAGE SUPPLY TERMINAL
S1 to S7; SWITCHES
C1, C2; CAPACITORS
M1 to M9, M21 to M29; TRANSISTORS

FIG. 13 CONVENTIONAL ART

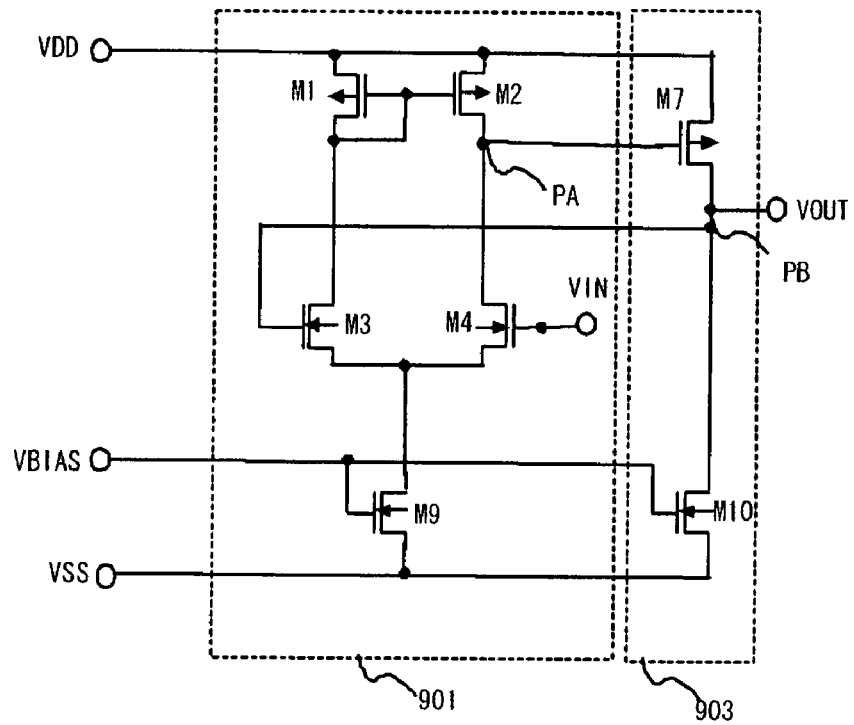

VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
M1 TO M10; TRANSISTORS
901; DIFFERENTIAL STAGE CIRCUIT
903; OUTPUT STAGE AMPLIFIER CIRCUIT
PA; DIFFERENTIAL STAGE OUTPUT
PB; OUTPUT STAGE AMPLIFIER CIRCUIT OUTPUT

FIG. 14 CONVENTIONAL ART

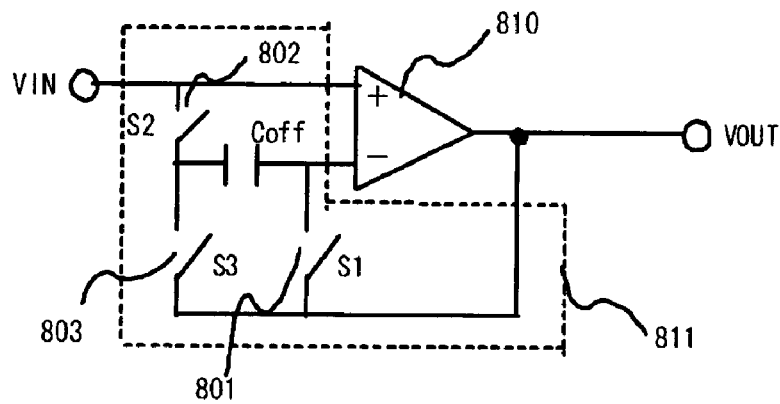

801, 802, 803 (S1, S2, S3); SWITCHES
810; OP AMPLIFIER
811; OFFSET CANCELLATION CIRCUIT
Coff; OFFSET DETECTION CAPACITOR

FIG. 15  CONVENTIONAL ART

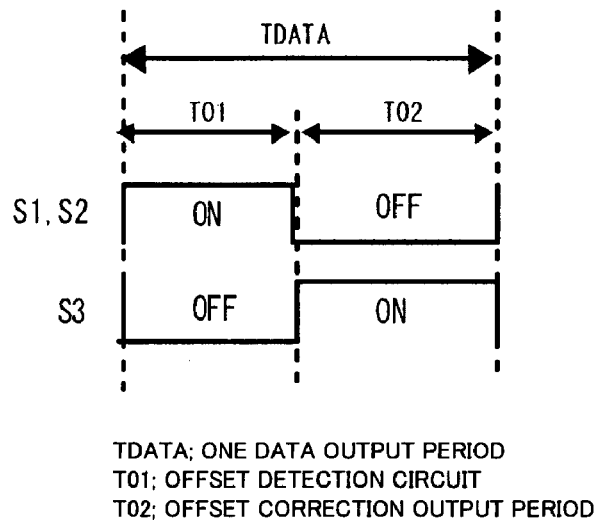

TDATA; ONE DATA OUTPUT PERIOD
T01; OFFSET DETECTION CIRCUIT
T02; OFFSET CORRECTION OUTPUT PERIOD

FIG. 16  CONVENTIONAL ART

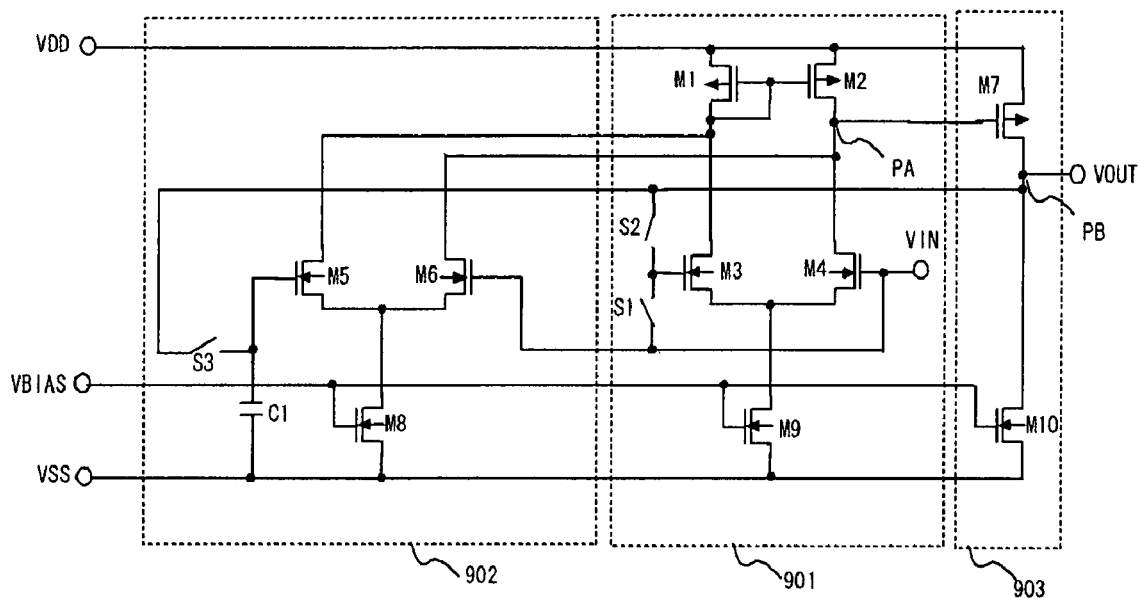

VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1, S2, S3; SWITCHES
C1; CAPACITOR
M1 to M10; TRANSISTORS

901; DIFFERENTIAL CIRCUIT
902; OFFSET CANCELLATION CIRCUIT
903; OUTPUT STAGE AMPLIFIER CIRCUIT
PA; DIFFERENTIAL AMPLIFIER CIRCUIT OUTPUT
PB; OUTPUT STAGE AMPLIFIER CIRCUIT OUTPUT

FIG. 17 CONVENTIONAL ART

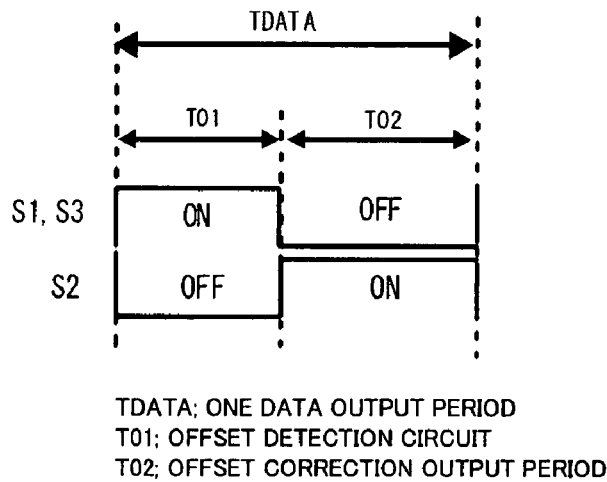

TDATA; ONE DATA OUTPUT PERIOD
T01; OFFSET DETECTION CIRCUIT
T02; OFFSET CORRECTION OUTPUT PERIOD

FIG. 18 CONVENTIONAL ART

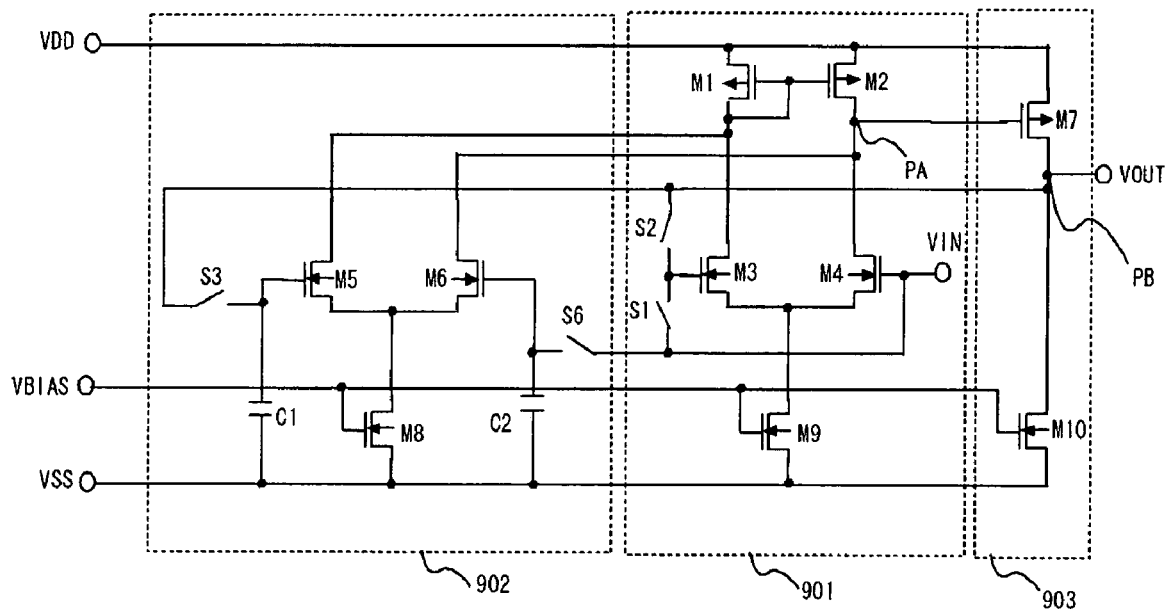

VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1, S2, S3, S6; SWITCHES
C1, C2; CAPACITOR

M1 to M10; TRANSISTORS
901; DIFFERENTIAL CIRCUIT
902; OFFSET CANCELLATION CIRCUIT
903; OUTPUT STAGE AMPLIFIER CIRCUIT
PA; DIFFERENTIAL AMPLIFIER CIRCUIT OUTPUT
PB; OUTPUT STAGE AMPLIFIER CIRCUIT OUTPUT

FIG. 19  CONVENTIONAL ART

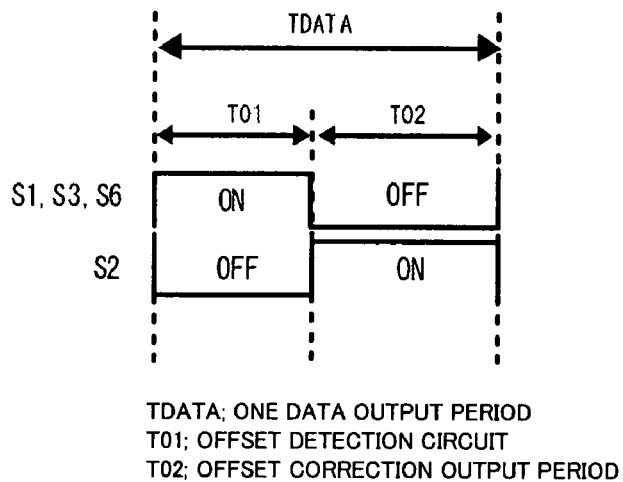

TDATA; ONE DATA OUTPUT PERIOD
T01; OFFSET DETECTION CIRCUIT
T02; OFFSET CORRECTION OUTPUT PERIOD

FIG. 20  CONVENTIONAL ART

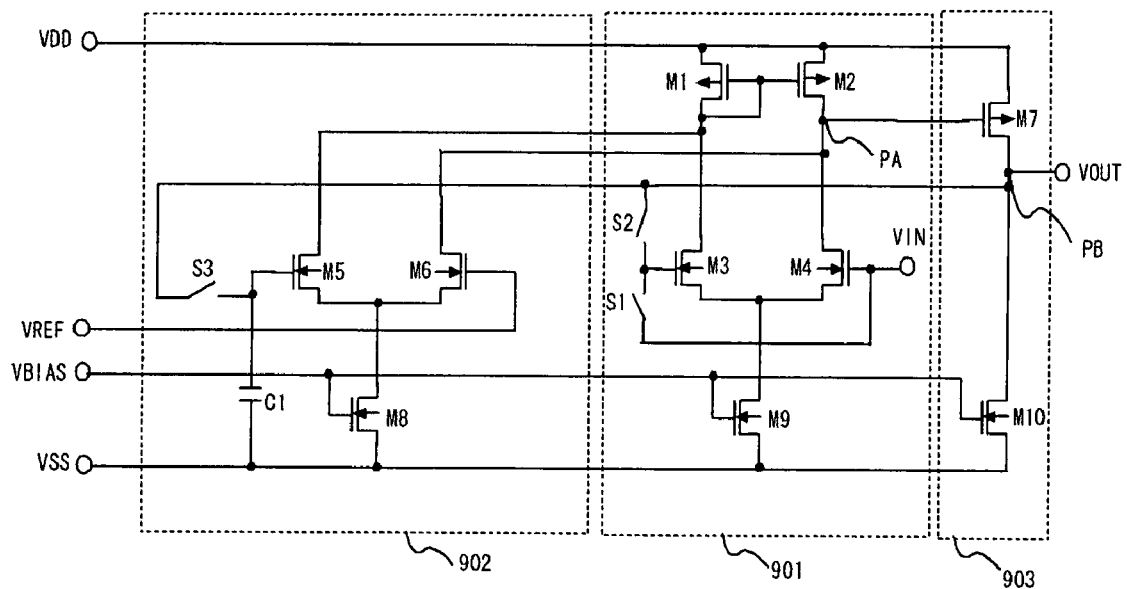

VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
VREF; REFERENCE VOLTAGE SUPPLY TERMINAL
S1, S2, S3; SWITCHES
C1; CAPACITOR

M1 to M10; TRANSISTORS
901; DIFFERENTIAL CIRCUIT
902; OFFSET CANCELLATION CIRCUIT
903; OUTPUT STAGE AMPLIFIER CIRCUIT
PA; DIFFERENTIAL AMPLIFIER CIRCUIT OUTPUT
PB; OUTPUT STAGE AMPLIFIER CIRCUIT OUTPUT

FIG. 21    CONVENTIONAL ART

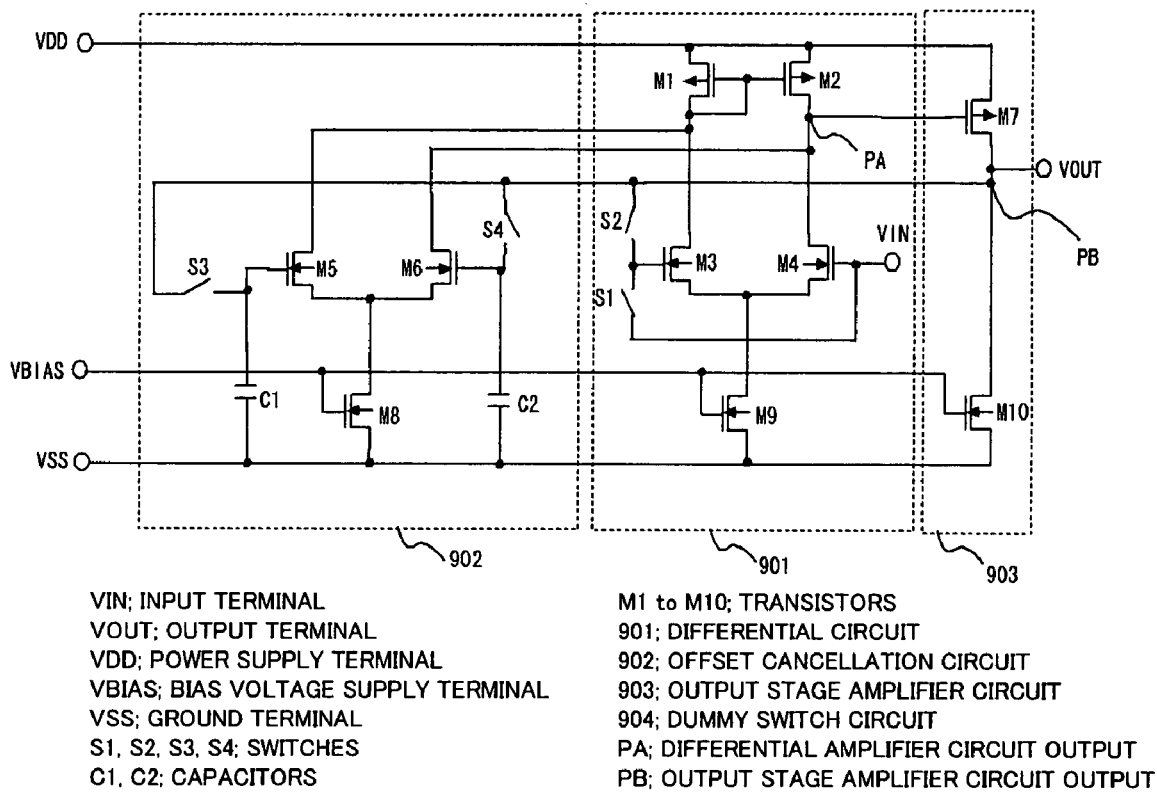

VIN; INPUT TERMINAL
VOUT; OUTPUT TERMINAL
VDD; POWER SUPPLY TERMINAL
VBIAS; BIAS VOLTAGE SUPPLY TERMINAL
VSS; GROUND TERMINAL
S1, S2, S3, S4; SWITCHES
C1, C2; CAPACITORS

M1 to M10; TRANSISTORS
901; DIFFERENTIAL CIRCUIT
902; OFFSET CANCELLATION CIRCUIT
903; OUTPUT STAGE AMPLIFIER CIRCUIT
904; DUMMY SWITCH CIRCUIT
PA; DIFFERENTIAL AMPLIFIER CIRCUIT OUTPUT
PB; OUTPUT STAGE AMPLIFIER CIRCUIT OUTPUT

FIG. 22    CONVENTIONAL ART

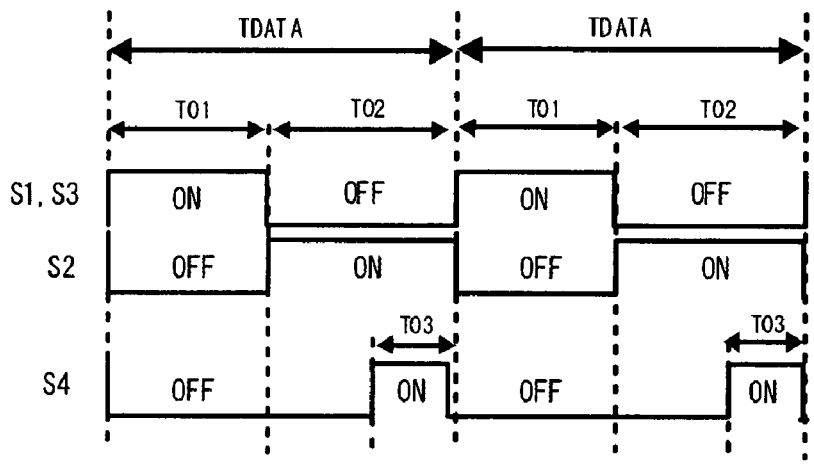

TDATA; ONE DATA OUTPUT PERIOD
T01; OFFSET DETECTION CIRCUIT
T02; OFFSET CORRECTION OUTPUT PERIOD
T03; CHARGING (DISCHARGING) PERIOD FOR CAPACITOR C2

US 7,535,294 B2

OFFSET CANCELLATION AMPLIFIER, DISPLAY EMPLOYING THE OFFSET CANCELLATION AMPLIFIER AND METHOD FOR CONTROLLING THE OFFSET CANCELLATION AMPLIFIER

FIELD OF THE INVENTION

This invention relates to an offset cancellation amplifier, in particular, an offset cancellation amplifier adapted for suppressing the effect of noise and which is provided with a circuit for reducing input capacitance. This invention also relates to a method for controlling the offset cancellation amplifier.

BACKGROUND OF THE INVENTION

In a liquid crystal display, an operational amplifier has been in use as an amplifier in driving a load on a data line. For example, an operational amplifier shown in FIG. 13 comprises a differential amplifier 901 and an output stage amplifier circuit 903. Of these, the differential amplifier 901 includes a differential pair, composed of NMOS transistors M3 and M4, having sources connected in common, and an active load circuit, which is a current mirror. This current mirror is composed of a PMOS transistor M1, having a source connected to a power supply VDD (high side power supply or positive power supply) and having its gate connected to its drain, and a PMOS transistor M2, having a source connected to the power supply VDD and having a gate connected in common to the gate of the PMOS transistor M1. The differential amplifier 901 also includes an NMOS transistor M9 having a source connected to a power supply VSS (low side power supply or negative power supply) and having a drain connected to common sources of NMOS transistors M3 and M4. The NMOS transistor M9 has a gate supplied with a constant voltage and operates as a constant current source. In the example shown in FIG. 13, the output stage amplifier circuit 903 is designed and constructed as a common source active load amplifier circuit, and is composed of a PMOS transistor M7 and an NMOS transistor M10. The PMOS transistor M7 has a source connected to the power supply VDD, while having a gate connected to an output point PA of the differential amplifier circuit and having a drain connected to an output terminal VOUT. The NMOS transistor M10 has a source connected to the power supply VSS, while having a drain connected to the drain of the PMOS transistor M7 and having a gate supplied with a bias voltage VBIAS to constitute a constant current source. The NMOS transistor M4 has a gate connected to an input terminal VIN. The output terminal VOUT is connected in a feedback fashion to the gate of the NMOS transistor M3.

The voltage at the output terminal VOUT (voltage at an output point PB) is determined by a balanced point between the drain current of the PMOS transistor M7 of the output stage amplifier circuit 903, determined in turn by the voltage at the input terminal VIN, and the drain current of the NMOS transistor M10 of the constant current source.

However, an operational amplifier suffers from an output offset voltage produced due to variations in characteristics of mainly the active elements such as transistors. These variations in characteristics are due in turn to fluctuations in an oxide film of a MOS transistor, in impurity concentrations or in device size W/L, where W is the channel width and L is a channel length. These fluctuations are derived from the fabrication process and are unavoidable despite endeavors in designing, such as adjustments of element sizes.

In particular, the variations in characteristics of a transistor of a differential circuit section appear pronouncedly as output offset. Ideally, the NMOS transistors M3 and M4 are of the same characteristics, while the PMOS transistors M1 and M2 are also of the same characteristics. However, in actuality, the transistor characteristics are not wholly of the same characteristics, due to constraints in the fabrication process, as described above.

In general, the offset voltage ascribable to fluctuations in characteristics of the transistors of the differential circuit section is proportionate to $1/\sqrt{S}$, where S denotes the transistor gate area of the transistor. Thus, for reducing the offset voltage, the gate needs to be of a broader area. This increases the chip area, such that there is imposed a limitation in case the offset voltage itself is high. For coping with this problem, a circuit (offset cancellation amplifier) is used for correcting the output offset through use of a capacitance element.

FIG. 14 shows a configuration of an offset cancellation amplifier, which has so far been used, and FIG. 5 is a timing diagram for illustrating its control method. A circuit for offset cancellation 811 includes an offset detection capacitor Coff and switches 801 to 803. The capacitor Coff has one end connected via a switch (S2) 802 to an input terminal VIN, while having the other end connected to an inverting input terminal (−) of an operational amplifier 810. A switch (S1) 801 is connected between the inverting input terminal (−) of the operational amplifier 810 and an output terminal VOUT, while a switch (S3) 803 is connected between a connection point of the capacitor Coff to the switch S2 and the output terminal VOUT.

A voltage Vin, received by the input terminal VIN of the operational amplifier 810, is supplied to a non-inverting input terminal (+) of the operational amplifier 810. The output terminal VOUT of the operational amplifier 810 is output to outside to drive a load, not shown, connected to outside.

The operation of the offset cancellation amplifier, shown in FIG. 14, will now be described with reference to the timing diagram of FIG. 15. Meanwhile, in FIG. 15, symbols S1, S2 and S3 correspond to switches (S1) 801, (S2) 802 and (S3) 803 of FIG. 14, respectively. Each data output period is composed of an offset detection period T01 and an offset correction output period T02.

During the offset detection period T01, the switches S1 and S2 are in an on state, and the switch S3 is turned off. This sets one end of the offset detection capacitor Coff to the input terminal VIN, with the potential of the one end of the capacitor being set to the input voltage VIN. Since the switch S1 is on, the potential of the other end of the capacitor Coff is set at the output voltage Vout.

Hence, the voltage applied across the terminals of the capacitor Coff is

Vout−Vin=(Vin+Voff)−Vin=Voff so that electric charge equivalent to the offset voltage Voff is accumulated in the capacitor Coff (offset detection period).

During the offset correction output period T02, the switches S1 and S2 are in an off state, and thereafter the switch S3 is in an on state. Since the switches S1 and S2 are in an off state, the offset voltage Voff, the offset voltage Voff keeps on to be retained in the capacitor Coff. By setting the switch S3 on, a voltage corresponding to the output voltage Vout during the period T01, as a reference voltage, less the offset voltage Voff, is applied to the inverting input terminal (−) of the operational amplifier 810

As a result, the output voltage Vout is

Vout=(Vin+Voff)−Voff=Vin and hence the offset voltage is corrected to allow for outputting the voltage in high accuracy (offset correction output period).

However, the above-described conventional offset cancellation amplifier is plagued with the following problem.

That is, since the input terminal VIN is connected to one end of the capacitor Coff, the effective input capacitance of the amplifier is increased. The smaller the input capacitance of the amplifier, the smaller is power consumption. On the other hand, a certain moderate magnitude of the offset detection capacitor Coff is needed in order to maintain the voltage for a preset period of time and in order to minimize an offset error ascribable to electric charge generated when the switch is off.

In addition, in the case of the offset cancellation amplifier, shown in FIG. 14, the input terminal VIN and the output terminal VOUT are electrically connected to each other during the time period T01 via the capacitor Coff to constitute a positive feedback loop. Thus, in case an external power supply for supplying the voltage to the input terminal VIN is low in supply capacity, there are cases where the output voltage becomes unstable.

For the above reason, it is not desirable to connect a capacitance element to the input terminal VIN of the amplifier.

In the case of a TFT (Thin Film Transistor), manufactured by a low temperature polysilicon process, the threshold values of transistors making up the TFT circuit exhibit significant fluctuations. Hence, the offset cancellation amplifier of FIG. 14 is unable to correct the offset completely, with the result that output offset may be produced or the circuit operation may be disabled.

An offset cancellation amplifier, with which it is possible to solve the aforementioned problem of increased input capacitance or defects in the circuit operation, is disclosed in for example Patent Document 1 (JP Patent 2001-292401). FIGS. 16 and 17 hereof show the circuit configuration and a timing diagram for illustration of the control method, respectively. Referring to FIG. 16, the circuit includes NMOS transistors M5 and M6, having sources connected in common to form a differential pair, and NMOS transistors M3 and M4, having sources connected in common to form another differential pair. The circuit also includes an NMOS transistor M8 having a source connected to a power supply VSS, while having a drain connected to the common source of the differential pair (M5, M6) and having a gate supplied with a VBIA voltage to constitute a current source. The circuit also includes an NMOS transistor M9 having a source connected to the power supply VSS, while having a drain connected to the common source of the differential pair (M3, M4) and having a gate supplied with the VBIA voltage to constitute a current source. The circuit also includes a current mirror circuit, composed of PMOS transistors M1 and M2, and constitutes a common active load for the differential pairs (M3, M4) and (M5, M6). The PMOS transistor M1 has a source connected to the power supply VDD, and has a drain and a gate connected together, while the PMOS transistor M2 has a source connected to the power supply VDD and has a gate connected to the gate of the PMOS transistor M1. The circuit also includes a PMOS transistor M7, having a source connected to the power supply VDD, while having a gate connected to a connection point between the drains of the MOS transistors M2 and M4 and having a drain connected to the output terminal VOUT. The circuit also includes an NMOS transistor M10, having a source connected to the power supply VSS, while having a drain connected to the output terminal VOUT and having a gate supplied with the VBIAS voltage. The circuit also includes switches S1 and S2 between the input terminal VIN and the gate of the NMOS transistor M3 and between the output terminal VOUT and the gate of the NMOS transistor M3, and a switch S3 between the gate of the NMOS transistor M5 and the output terminal VOUT. The circuit further includes a capacitor C1 between the gate of the NMOS transistor M5 and the power supply VSS.

The operation of the offset cancellation amplifier, disclosed in Patent Document 1, will now be described with reference to the circuit configuration of FIG. 16 and to the timing diagram of FIG. 17. During an offset detection period T01 of one data output period TDATA, the switches S1 and S3 are in an on state, while the switch S2 is turned off. At this time, the differential pair (M3, M4) both receives the input voltage Vin, supplied to the input terminal VIN, so that the differential pair (M3, M4) operates as a current source for the current mirror circuit (M1, M2). Out of the transistors of the differential pair (M5, M6), the transistor M6 has a gate connected to the input terminal VIN, and the transistor M5 has a gate connected to the output terminal VOUT. In this case, the voltage Vout of the output terminal is stabilized, by a negative feedback operation, to a voltage inclusive of an offset voltage Voff, ascribable to fluctuations in characteristics of the transistors in the differential circuit, that is, (Vin+Voff). Since the capacitor C1 is connected to the gate of the transistor M5, the potential of Vout in the stabilized state is set in the capacitor.

During an offset correction output period T02 of one data output period, the switches S1 and S3 are in an off state, while the switch S2 is in an on state. At this time, the same voltage as that applied during the period T01 keeps on to be supplied to the differential pair (M5, M6). Since the input terminal remains connected to the gate of the transistor M4, and the output terminal VOUT is connected to the gate of the transistor M3, in a negative feedback fashion, the voltage Vout is stabilized at a potential which is the same as one during the time period T01. That is, the output voltage Vout becomes equal to the input voltage Vin, during the time period T02, thus correcting the offset.

The offset cancellation amplifier in the example of Patent Document 1 is desirable since a capacitance element for offset detection is not connected to the input terminal VIN of the amplifier, and hence the input capacitance is not increased due to addition of the circuit for offset cancellation, while the amplifier has high operational stability.

In addition, a modification of FIG. 16, shown in FIG. 18, is configured for suppressing the adverse effect of the ground noise or the power supply noise. A capacitor C2 is connected across the gate of an NMOS transistor M6, as one of the transistors of the differential pair, while a switch S6 is connected across the gate of transistor M6 and the input terminal VIN.

The operation of the circuit configuration of FIG. 18 will now be described with reference to the timing diagram of FIG. 19. During the offset detection period T01, the switches S1, S3 and S6 are in an on state, while the switch S2 is turned off. Hence, the input voltage Vin is supplied to the differential pair (M3, M4), and the differential pair (M3, M4) operates as a current source for the current mirror circuit (M1, M2). The transistors M5 and M6 forming the differential pair, is supplied with the output voltage Vout and the input voltage Vin, respectively. At this time, the input voltage Vin is accumulated in the capacitor C2, while a voltage composed of the input voltage and the offset voltage Vof added thereon (Vin+Vof) is accumulated in the capacitor C1.

Next, during the offset correction output period T02, the switches S1, S3 and S6 are in an off state, while the switch S2 is in an on state. At this time, the voltage (Vin+Vof), accumulated and retained in the capacitor C1, and the voltage Vin, accumulated and retained in the capacitor C2, are supplied to input pairs of the differential pair (M5, M6), respectively. The output voltage Vout and the input voltage Vin are supplied to input pairs of the differential pair (M3, M4), respectively. With the circuit of FIG. 18, as in the circuit of FIG. 16, it is possible to cancel the output offset and to output an amplified voltage which is approximately equal to the input voltage.

Here, the properties of the differential circuit of amplifying a differential signal and removing in-phase signals are exploited. Hence, the adverse effect of the power supply noise due to VSS may be removed. That is, with the configuration shown in FIG. 18, it is possible to output the voltage more accurately than with the configuration of FIG. 16.

The circuit configuration of FIG. 18 may be modified as illustrated in Patent Document 2 (JP Patent Kokai Publication No. JP-P2003-168936A). FIG. 20 shows the so modified configuration.

The configuration of FIG. 20 is modified from the circuit of FIG. 18 in supplying a reference voltage VREF to the gate of the NMOS transistor M6. The switches S1 to S3 are controlled in the same way as shown in the timing diagram of FIG. 19.

The configuration of FIG. 20 differs from that of FIG. 18 in supplying (Vref+Vof) and Vref to the input pair of the differential pair (M5, M6). That is, the reference voltage Vref at a reference voltage supply terminal VREF may be optionally set.

Meanwhile, this reference voltage Vref may be set as a median voltage at the output voltage range of the amplifier circuit for further decreasing the potential fluctuations of the output voltage Vout during the time period T01. As a result, the time T01 as the time for preparing for offset cancellation may be made shorter to provide for a longer time for the time period T0 in which to carry out correction outputting.

As the configuration for shortening the offset detection period, there is known a circuit configuration shown in Patent Document 3 (JP Patent Kokai Publication No. JP-P2005-117547A). FIGS. 21 and 22 depict the circuit configuration and a timing diagram for controlling the switches, respectively. The circuit configuration of FIG. 21 presets the output voltage Vout, which prevailed one horizontal period before, that is, one output period before, as a reference voltage Vref of the output configuration of FIG. 20, in the capacitor C2, to provide for a shorter offset detection time.

The principle of shortening the offset detection time will now be described with reference to the circuit diagram of FIG. 21 and to the timing diagram shown in FIG. 22.

The input voltage for the first horizontal period H1 and that for the second horizontal period H2 are labeled Vin1 and Vin2, respectively.

During a time T02 of the first horizontal period H1, the switch S2 is turned on, while the switches S1 and S3 are turned off. At this time, the switch S4 is off. Since the offset is canceled for the reason as stated later, the output voltage is such that Vout1=Vin1.

When the switch S4 is turned on during the time T03 provided within the time T02, the output terminal VOUT is connected to both the capacitor C2 and the gate of M6. At this time, Vout1, that is, Vin1, is accumulated in the capacitor C2. When the voltage at the capacitor C2 is stabilized sufficiently, S4 is turned off, so that Vout1 (=Vin1) is retained in the capacitor C2.

During the time T01 of the next horizontal period H2, the switches S1 and S3 are turned on, while the switch S2 is turned off. At this time, (Vin2, Vin2) are applied to the input pair of the differential pair (M3, M4), while (Vout1+Vof, Vout1) are applied to the inputs pair of the differential pair (M5, M6). Since the voltage at the output end Vout (voltage at PB) is necessarily stabilized at this time, that is, at the end of the horizontal period H1, it is sufficient to vary only the output potential by only a difference Vof from Vout1, at the start time point of the horizontal period H2, thus providing for a shorter offset detection time.

However, the circuit configuration of FIG. 21 suffers from the problem that the output voltage Vout is varied during time T03, thus worsening output correction accuracy. Such problem arises from differential voltages applied to the inputs of the differential pair (M5, M6) before and after start of the time T03 during the horizontal period H2, as will now be described.

That is, directly before the beginning of the time T03, (Vout1+Vof1, Vout2) are supplied to the input pair of the differential pair (M5, M6). (Vout2, Vin2) keep on to be applied to the inputs of the differential pair (M3, M4). The output terminal VOUT is connected at this time to both the non-inverting input terminal of the first differential pair (gate of M6) and the inverting input terminal of the second differential pair (gate of M5), so that positive feedback is partially applied.

During the horizontal period H2, only the voltage Vout2 at the output terminal may be varied. Hence, the voltage applied to the gate of the transistor M6 is Vout2, during the period T03, thus upsetting the drain current balance of the two differential pairs. As a result, the output potential Vout during the time T03 is increased or decreased, depending on the input states of the differential pairs, thus worsening output accuracy.

[Patent Document 1] JP Patent Kokai Publication No. JP-P2001-292041A

[Patent Document 2] JP Patent Kokai Publication No. JP-P2003-168936A

[Patent Document 3] JP Patent Kokai Publication JP-P2005-117547A

[Non-Patent Document 1] Design and Application of Analog CMOS Integrated Circuit, translated by Tadahiro Kuroda et al. pp 508-515, Maruzen, 2003

SUMMARY OF THE DISCLOSURE

In a color liquid crystal display of recent days, the number of gray scale levels, that is, the number of colors displayed, is increasing in order to achieve higher display quality, so that a demand is raised for output of higher quality. The aforementioned offset cancellation amplifier, shown in FIG. 16, for example, is of high accuracy, however, the accuracy in the output cannot be raised beyond a certain limit, because of variations in the potential retained by the capacitor C1 due to noise from the ground or to noise generated when switch is off.

The offset cancellation amplifier, shown in FIG. 18, is highest in output accuracy, because a capacitor C2, paired to the capacitor C1, is provided, and hence the noise is mixed equally on the two capacitors C1 and C2, thus canceling the noise as in-phase signal.

However, the offset cancellation amplifier, shown in FIG. 18, suffers from the problem that, since the capacitor C2 is charged (or discharged) with the voltage Vin of an input terminal from an external power supply, the effective input capacitance of the operational amplifier is increased. The input capacitance is in a relationship of trade-off to power consumption and hence is desirably as small as practicable.

Accordingly, it is therefore an object of the present invention to provide an offset cancellation amplifier of high accuracy in which it is possible to suppress the input capacitance and the effect of variations from device to device as well as the effect of noise.

It is another object of the present invention to provide an offset cancellation amplifier in which it is possible to assure a shorter offset detection time, For accomplishing the above objects, the invention disclosed herein substantially resides in the following configuration. In the following description, the numbers or symbols in parentheses ( ) denote those used in the description of preferred examples of the invention and are intended for clarifying the relationship of correspondence with the claims without restricting the invention to the particular examples.

In one aspect, the present invention provides an offset cancellation amplifier comprising a differential stage including first and second differential pairs (M5, M6), (M3, M4) and a load circuit (M1, M2) connected in common to output pairs of the first and second differential pairs, an amplifier stage (103) receiving a common output signal of the first and second differential pairs and outputting an amplified signal to an output terminal, and first and second capacitors (C1, C2). Control signals for controlling signal supplied to the input pairs of the first and second differential pairs are supplied to a switch circuit (e.g., S1 to S6). According to the present invention, a data output period includes first, second and third periods (TC, TD and TB). The first capacitor (C1) is connected for all time to one input of the input pair of the first differential pair (i.e., to the gate of M5).

During the first period (TC), the voltage (Vout) at the output terminal is supplied to one input of the input pair of the first differential pair (M5, M6), that is, to the gate of M5, while a reference voltage (Vref) is supplied to the other input of the input pair. The voltage (Vout) at the output terminal is accumulated in common in the first and second capacitors (C1 and C2) as the second capacitor (C2) is disconnected from the other input of the input pair of the first differential pair that is, from the gate of M6. A voltage at an input terminal (Vin) is supplied in common to the input pair of the second differential pair, that is, to the gates of M3 and M4.

During the second period (TD), the second capacitor (C2) is disconnected from the first capacitor (C1) and connected to the other input of the input pair of the first differential pair (gate of M6). The voltage (Vout) at the output terminal and the reference voltage (Vref) are accumulated in the first and second capacitors (C1 and C2), respectively. The voltage at the input terminal (Vin) is supplied in common to the input pair of the second differential pair, that is, to the gates of M3 and M4.

During the third period (TB), the input pair of the first differential pair, that is, the gates of M5 and M6, are disconnected from the voltage (Vout) at the output terminal and from the reference voltage (Vref), respectively, and are supplied with the voltages accumulated in the first and second capacitors (C1 and C2), respectively. The voltage (Vout) at the output terminal and the voltage (Vin) at the input terminal are supplied to the one input (gate of M3) and the other input of the input pair of the second differential pair, respectively.

In the offset cancellation amplifier according to the present invention, the data output period includes first, second and third periods (TC, TD and TB), and the above-described control signals on/off control the first to sixth switches (S1 to S6).

During the first period (TC), the second and sixth switches (S2, S6) are in an off state, and the voltage (Vout) at the output terminal is supplied to one input (gate of M6) of the differential inputs of the first differential pair, via third switch (S3) in an on state, while the aforementioned reference voltage (Vref) is supplied to the other input via fourth switch (S4) in an on state. The voltage (Vin) at the input terminal is supplied to one input (gate of M3) of the differential input of the second differential pair, via first switch (S1) in an on state, while the voltage (Vin) at the input terminal is supplied to the other input (gate of M4). The first and second capacitors (C1 and C2) are supplied with the voltage (Vout) at the output terminal via third and fifth switches (S3, S5) in an on states, respectively.

During the second period (TD), the second and fifth switches (S2, S5) are in an off state, and the second capacitor (C2) is connected to the other input (gate of M6) of the differential input of the first differential pair via sixth switch (S6) in an on state, while being supplied with the reference voltage (Vref).

During the third period (TB), the first, third, fourth and fifth switches (S1, S3, S4 and S5) are in an off state, and the one input (gate of M3) of the differential input of the second differential pair is supplied with the voltage (Vout) at the output terminal via second switch (S2) in an on state and the other input (gate of M4) of the differential input of the second differential pair is supplied with the voltage (Vin) at the input terminal.

According to the present invention, the output voltage (Vout) may promptly be set at a desired potential in case the reference voltage (Vref) is varied every data output period in association with the input voltage (Vin). The reference voltage (Vref) may be the same as Vin.

In another aspect, the present invention provides an offset cancellation amplifier comprising a differential stage including first and second differential pairs (M5, M6), (M3, M4) and a load circuit (M1, M2) connected in common to output pairs of the first and second differential pairs, an amplifier stage (103) receiving a common output signal of the first and second differential pairs and outputting an amplified signal at an output terminal, and first and second capacitors (C1, C2). Control signals for controlling signal supplied to the input pairs of the first and second differential pairs of the first and second differential pairs are supplied. A data output period includes first, second and third periods (TC, TD and TB). The first capacitor (C1) is connected for all time to one input of the input pair of the first differential pair (i.e., to the gate of M5).

During the first period (TC), the voltage (Vout) at the output terminal is supplied to one input (gate of M5) of the input pair of the first differential pair, while the voltage (Vin) at the input terminal is supplied to the other input (gate of M6). The voltage (Vout) at the output terminal is supplied to one input (gate of M3) of the differential input of the second differential pair, while the voltage (Vin) at the input terminal is supplied to the other input (gate of M4). The second capacitor (C2) is disconnected from the other input (gate of M6) of the differential input of the first differential pair. In this state, the voltage (Vout) at the output terminal is accumulated in common in the first and second capacitors (C1 and C2).

During the second period (TD), the voltage (Vin) at the input terminal is supplied in common to both inputs of the differential input of the second differential pair (gates of M3 and M4), and the first and second capacitors (C1) and (C2) are disconnected. The second capacitor (C2) is connected to the other input (gate of M6) of the differential input of the first differential pair. The voltage (Vout) at the output terminal and the voltage (Vin) at the input terminal are accumulated in the first and second capacitors (C1) and (C2), respectively During the third period (TB), the differential input of the first differential pair (gates of M5 and M6) is disconnected from the voltage (Vout) at the output terminal and the voltage (Vin) at the input terminal, respectively, and supplied with the voltage accumulated in the first and second capacitors (C1 and C2). The voltage (Vout) at the output terminal is supplied to one input (gate of M3) of the differential input of the second differential pair, while the voltage (Vin) at the input terminal is supplied to the other input (gate of M4).

In the offset cancellation amplifier, according to the present invention, the data output period includes first to third periods (TC, TD and TB). There are provided first to sixth switches (S1 to S6).

During the first period (TC), the first to sixth switches (S1 to S6) are in an off state. One input (gate of M5) of the differential input of the first differential pair is supplied with the voltage (Vout) at the output terminal, via third switch (S3) in an on state, while the other input (gate of M6) is supplied with the voltage (Vin) at the input terminal, via fourth switch (S4) in an on state. One input (gate of M3) of the differential input of the second differential pair is supplied with the voltage (Vout) at the output terminal, via second switch (S2) in an on state, while the other input (gate of M4) of the differential input of the second differential pair is supplied with the voltage (Vin) at the input terminal. The first and second capacitors C1 and C2 are supplied with the voltage (Vout) at the output terminal via third and fifth switches (S3 and S5) in an on states, respectively.

During the second period (TD), the second and fourth switches (S2, S5) are in an off state, and the second capacitor (C2) is connected to the other input (gate of M6) of the differential input of the first differential pair through the sixth switch (S6) in an on state, while being supplied with the voltage (Vin) at the input terminal.

During the third period (TB), the first, third, fourth and fifth switches (S1, S3, S4 and S5) are in an off state. The one input (gate of M3) of the differential input of the second differential pair is supplied with the voltage (Vout) at the output terminal, via second switch (S2) in an on state and the other input (gate of M4) of the differential input of the second differential pair is supplied with the voltage (Vin) at the input terminal.

According to the present invention, there may be provided a seventh switch (S7) which is in an on state for all time. The seventh switch is provided between a connection point between one input (gate of M5) of the differential input of the first differential pair and the third switch (S3) and the first capacitor (C1). The capacitance values of the first and second capacitors (C1 and C2) may be made equal to each other, while the transistors of the third and fourth switches (S3 and S4) may be of equal device size. In addition, the control signals for the third and four switches (S3 and S4) may be made equal to each other.

The meritorious effects of the present invention are summarized as follows.

According to the present invention, the offset ascribable to variations in device characteristics or noise may be corrected to allow outputting the voltage to high accuracy as a result of the operation of two capacitance elements and two differential pairs. Moreover, according to the present invention, it is possible to reduce input capacitance in the configuration of the operational amplifier.

Still other features and advantages of the present invention will become readily apparent to those skilled in this art from the following detailed description in conjunction with the accompanying drawings wherein embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 1 is a circuit diagram showing the configuration of a first example of the-present invention.

FIG. 2 is a timing diagram showing an example of switch control of the first example of the present invention.

FIG. 3 is a circuit diagram showing a modification of the first example of the present invention.

FIG. 4 is a circuit diagram showing the configuration of a second example of the present invention.

FIG. 5 is a circuit diagram showing the configuration of a third example of the present invention.

FIG. 6 is a timing diagram showing an example of switch control of the third example of the present invention.

FIG. 7 is a circuit diagram of a modification of the third example of the present invention.

FIG. 8 is a circuit diagram of another modification of the third example of the present invention.

FIG. 9 is a circuit diagram showing the configuration of a fourth example of the present invention.

FIGS. 10A, 10B and 10C are schematic views showing examples of a switch noise cancellation circuit used in the fourth example of the present invention.

FIG. 11 is a circuit diagram showing the configuration of a fifth example of the present invention.

FIG. 13 is a circuit diagram showing the configuration of a conventional OP amplifier.

FIG. 14 is a circuit diagram showing the configuration of a conventional offset cancellation amplifier.

FIG. 15 is a timing diagram showing the method for controlling the offset cancellation amplifier shown in FIG. 14.

FIG. 16 is a circuit diagram showing the configuration of an offset cancellation amplifier described in a first example of Patent Document 1 (JP Patent Kokai Publication No. JP-P2001-292041A).

FIG. 17 is a timing diagram showing the method for controlling the offset cancellation amplifier described in the first example of Patent Document 1 (JP Patent Kokai Publication No. JP-P2001-292041A).

FIG. 18 is a circuit diagram showing the configuration of an offset cancellation amplifier described in a fourth example of Patent Document 1 (JP Patent Kokai Publication No. JP-P2001-292041A).

FIG. 19 is a timing diagram showing the method for controlling the offset cancellation amplifier described in the fourth example of Patent Document 1 (JP Patent Kokai Publication No. JP-P2001-292041A).

FIG. 20 is a circuit diagram showing the configuration of an offset cancellation amplifier described in a first example of Patent Document 2 (JP Patent Kokai Publication No. JP-P2003-168936A).

FIG. 21 is a circuit diagram showing the configuration of an offset cancellation amplifier described in a first example of Patent Document 3 (JP Patent Kokai Publication No. JP-P2005-117547A).

FIG. 22 is a timing diagram showing the method for controlling the offset cancellation amplifier described in the first example of Patent Document 3 (JP Patent Kokai Publication No. JP-P2005-117547A).

EXAMPLES OF THE INVENTION

Figure 12:
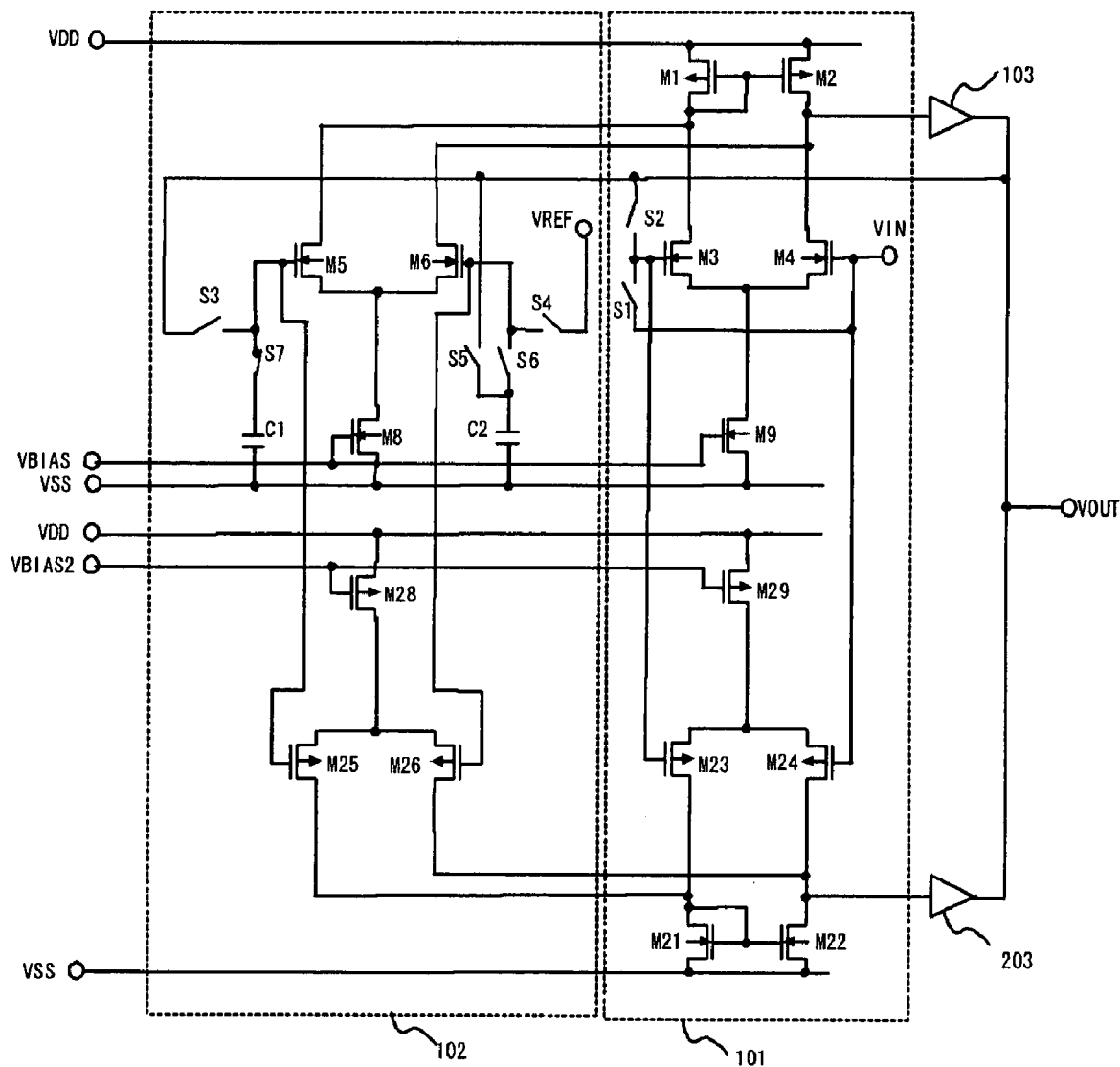
FIG. 12 is a circuit diagram showing the configuration of a sixth example of the present invention.

The present invention will now be described with reference to the accompanying drawings, in which the same symbols are used for depicting the same component parts.

First Example

The circuit configuration of a first example of the present invention will now be described. FIG. 1 shows the configuration of a differential amplifier according to the present invention. Referring to FIG. 1, the differential amplifier of the present example includes:

NMOS transistors M5 and M6 having sources connected in common to form a differential pair;

NMOS transistors M3 and M4, having sources connected in common to form another differential pair;

an NMOS transistor M8 having a source connected to a power supply VSS, having a drain connected to the common source of the differential pair (M5, M6) and having a gate supplied with a bias voltage from a bias voltage supply terminal VBIAS to constitute a current source;

an NMOS transistor M9 having a source connected to the power supply VSS, having a drain connected to the common source of the differential pair (M3, M4) and having a gate supplied with a bias voltage from the bias voltage supply terminal VBIAS to constitute another current source;

a current mirror circuit, which is composed of a PMOS transistor M1, having a source connected to a power supply VDD and having a drain and a gate connected together, and a PMOS transistor M2, having a source connected to the power supply VDD and having a gate connected to the gate of the PMOS transistor M1, and which constitutes a common active load for the differential pair (M3, M4) and the differential pair (M5, M6);

an amplifier stage 103, receiving a signal at a connection point PA of the drains of the PMOS transistor M2 and the NMOS transistor M4 to output an amplified signal at an output terminal VOUT; and capacitors C1 and C2 having one ends connected to the power supply VSS. The differential amplifier also includes:

a switch S1 connected between the gate of the NMOS transistor M3 and an input terminal VIN;

a switch S2 connected between the gate of the NMOS transistor M3 and the output terminal VOUT;

a switch S3 connected between the gate of the NMOS transistor M5 and the output terminal VOUT;

a switch S4 connected between a reference voltage supply terminal VREF and the gate of the NMOS transistor M6;

a switch S5 connected between the other end of the capacitor C2 and the output terminal VOUT;

a switch S6 connected between the other end of the capacitor C2 and the gate of the NMOS transistor M6; and a switch S7 connected between the other end of the capacitor C1 and the gate of the NMOS transistor M5.

In FIG. 1, the differential pair (M3, M4), the current source (M9), current mirror circuit (M1, M2) and the switches (S1, S2) constitute a differential circuit 101, while the differential pair (M5, M6), current source (M8), capacitors (C1, C2) and the switches (S1 to S7) constitute an offset cancellation circuit 102.

FIG. 2 shows an illustrative timing diagram for showing on/off control of the respective switches of the offset cancellation amplifier of FIG. 1 during one data output period, and specifically shows the manner of control for suppressing the input capacitance by the capacitor C2 from increasing.

When the reference voltage Vref is changed each data output period, it is necessary to supply a sufficient amount of electric charge from the reference voltage supply terminal VREF from an external power supply to the capacitor C2. It is noted that the effective input capacitance may be decreased by exercising the control shown in FIG. 2.

The operation of the offset cancellation amplifier of FIG. 1 by the control of FIG. 2 will now be described. In FIG. 2, each data output period is composed of an offset detection period TA and an offset cancellation period TB. The offset detection period TA is composed of an input capacitance reduction period TC and an offset charging/discharging period TD. Hence, the data output period is composed of three periods, namely the periods TC, TD and TB.

Initially, during the period TC, the switches S1, S3, S4 and S5 are turned on, while the switch S2 and S6 are turned off. Since the switch S6 is off at this time, the capacitor C2 is disconnected from the gate of the transistor M6, and is connected to the output terminal VOUT via the switch S5 which is in an on state. The reference voltage Vref is supplied to a non-inverting input of the differential pair (M5, M6), that is, to the gate of M6, while an output voltage Vout is fed back to the inverting input thereof via the switch S3 which is in an on state. Since the switch S1 is on, the input voltage Vin is supplied in common to the gates of the transistors M3 and M4.

The output voltage Vout at this time is a voltage equal to the reference voltage Vref as a reference plus the effect of variations in transistor characteristics and hence is given by $$Vout=Vref+Vof$$

where Vof is an offset voltage.

Thus, the period TC is a preliminary driving period when the capacitor C2 is disconnected from the gate of the transistor M6 and the capacitors C1 and C2 are connected to the output terminal VOUT to set the terminal voltages of the capacitors C1 and C2 to (Vref+Voff).

Then, during the period TD, the switches S1, S3, S4 and S6 are turned on, while the switches S2 and S5 are turned off. The capacitor C2 is disconnected at this time from the output terminal VOUT and is connected via switch S6 to the gate of the transistor M6, while being connected via switch S4 to the reference voltage supply terminal VREF. As a result, the voltage accumulated in the capacitor C2 is changed from (Vref+Vof) to Vref. This potential variance Vof of the capacitor C2, generated by electric charge supplied from VREF of the external supply terminal, is relatively small, so that only a small amount of electric charge supplied from outside suffices, thus allowing suppression of the effective input capacitance.

Then, during the period TB, the switches S2, S6 are in an on state, while the switches S1, S3, S4 and S5 are in an off state.

At this time, the voltages accumulated during the period TD, that is, Vref and (Vref+Vof), are retained in the capacitors C2 and C1, respectively.

Since the input pair (gates of M5, M6) of the differential pair (M5, M6) are supplied with voltages, retained in the capacitors C1, C2, the input pair is supplied with the voltage similar to that applied during the period TD. The input voltage Vin and the output voltage Vout are supplied to the non-inverting input terminal (gate of M4) and the inverting input terminal (gate of M3) in the differential pair (M3, M4), respectively.

Meanwhile, the voltages applied to the differential pair (M5, M6) remain unchanged throughout the periods TD and TB. Hence, the voltages applied to the differential pair (M3, M4) are kept in the same state as that during the period TD. Hence, during the period TB, Vout=Vin thus canceling the offset.

Thus, with the offset cancellation amplifier of the first example, it is possible to suppress the effect of the noise or the variations in characteristics of the transistors, by a sequence of switch control operations, thereby assuring highly accurate voltage output.

It is also possible, by providing the input capacitance reduction period TC for transiently storing the output voltage Vout in the capacitor C2, to suppress the input capacitance and power consumption from increasing.

The aim in providing the switch S7 in FIG. 1, which is in an on state for all time, is suppression of the effect of the switch noise produced when the switches S3 and S4 transition from the on-state to the off-state (that is, during transition from the period TA to the period TB). The switch noise may be suppressed in case the impedances connecting to the respective differential inputs of the first differential pair (M5, M6), that is, the parasitic capacitors of transistors and capacitance elements, are made equal to one another. It is therefore desirable to provide the switch S7 which will be paired with the switch S6. Moreover, the switches S6, S7 are of the same size, while the capacitors C1, C2 are preferably prepared by the same fabrication process and are of the same capacitance value.

FIG. 3 shows a modification of the offset cancellation amplifier shown in FIG. 1. The switch control and the circuit operation are the same as those of the circuit of FIG. 1. FIG. 3 differs from FIG. 1 only with respect to the position of the switch S5. That is, in the case of FIG. 1, the capacitor C2 is charged (discharged) via switch S5 in the on-state during the input capacitance reduction period TC. In the case of FIG. 3, the capacitor C2 is charged (discharged) via switches S3, S5 in the on-states (and also through switch S7 in the on-state for all time). The operation of FIG. 3 is the same as that of FIG. 1.

Second Example

The circuit configuration of the second example of the present invention will now be described. FIG. 4 shows the configuration of a differential amplifier of the second example of the present invention. In FIG. 4, the reference voltage supply terminal VREF in the circuit configuration of the first example in FIG. 1 is made the same as the input terminal VIN. That is, the point of difference of the present example from the first example shown in FIG. 1 resides in the connection to the switch S4. In the first example, the switch S4 is provided between the reference voltage supply terminal VREF and a connection point between the gate of the NMOS transistors M6 and the switch S6, whereas, in the configuration of FIG. 4, the switch S4 is provided between the input terminal VIN and a connection point between the gate of the NMOS transistor M6 and the switch S6. Hence, the reference voltage Vref is the input voltage Vin. The present example is otherwise the same as the example shown in FIG. 1. The timing diagram, showing the on/off control of the respective switches of the offset cancellation amplifier during one data output period, is the same as FIG. 2.

First, during the period TC, the switches S1, S3, S4 and S5 are turned on, while the switches S2 and S6 are turned off. The capacitor C2 is disconnected at this time from the gate of the transistor M6, and is connected via switches S5, S7 and S3, in the on-state, to the output terminal VOUT. The input terminal VIN is connected to the non-inverting input of the differential pair (M5, M6), that is, to the gate of M6, while the output terminal VOUT is connected in a feedback fashion to the inverting input thereof, that is, to the gate of M5. The input voltage Vin is connected in common to both inputs of the second differential pair (M3, M4).

The output voltage Vout at this time is a voltage equal to the reference voltage Vin as a reference added by the effect of variations in transistor characteristics, and hence is given by Vout=Vin+Vof where Vof is an offset voltage.

Hence, during the period TC, the capacitor C2 is disconnected from the gate of the transistor M6, whilst one end of the capacitor C1 and one end of the capacitor C2 are connected to the output terminal VOUT to drive the potential of the capacitor preliminarily to (Vref+Voff).

Then, during the period TD, the switches S1, S3, S4 and S6 are in an on state, while the switches S2 and S5 are in an off state. The capacitor C2 is disconnected at this time from the output terminal VOUT and is connected via switch S6 to the gate of the transistor M6, while being connected via switch S4 to the input voltage terminal VIN. At this time, the voltage accumulated in the capacitor C2 is changed from (Vin+Vof) to Vin. This potential variance Vof of the capacitor C2, generated by electric charge supplied from VREF, is of a relatively small magnitude, so that only a small amount of electric charge supplied from outside suffices, thus allowing suppression of the effective input capacitance.

Then, during the period TB, the switches S2, S6 are turned on, while the switches S1, S3, S4 and S5 are turned off.

At this time, the voltages accumulated during the period TD, that is, Vin and (Vin+Vof), are retained in the capacitors C2 and C1, respectively. Since the input pair of the differential pair (M5, M6) is supplied with voltages retained in the capacitors C1, C2, the input pair is supplied with the voltage similar to that applied during the period TD. The input voltage Vin and the output voltage Vout are supplied to the non-inverting input terminal (gate of M4) and the inverting input terminal (gate of M3) in the differential pair (M3, M4), respectively.

Meanwhile, the voltages applied to the differential pair (M5, M6) remain unchanged throughout the periods TD and TB. Hence, the voltages applied to the differential pair (M3, M4) are kept in the same state as that during the period TD. Hence, during the period TB, Vout=Vin thus canceling the offset.

In the second example, the potential is accumulated in the capacitors C1, C2 as reference is made to the input voltage Vin. The input voltage Vin is changed each data output period, such that it is necessary to re-charge (re-discharge) the capacitor C2 concomitantly. However, since the output voltage Vout is transiently accumulated in the capacitor C2 during the period TC, it is possible to decrease the amount of electric charge supplied from the outside input terminal to the capacitor C2 and hence to reduce input capacitance.

Thus, it is possible to suppress the effect of the noise or the variations in characteristics of the transistors, by a sequence of switch control operations, to provide for highly accurate voltage output. It is also possible, by providing the input capacitance reduction period TC for transiently storing the output voltage Vout in the capacitor C2, to suppress input capacitance and power consumption from increasing.

The method of employing two capacitance elements, that is, capacitors C1 and C2, in an input path of a differential pair, is shown in Patent publication 3 (FIG. 21). However, this Patent Document differs from the present invention as to the connection configuration to the capacitor C2 and the aim and effect of providing the capacitor C2.

In the configuration of FIG. 21, the capacitor C2 is provided for shortening the offset detection period, and the output potential Vout one horizontal period before is accumulated in the capacitor C2. That is, the output voltage Vout is accumulated in the capacitor C2, during the period T03 of FIG. 22, via switch S4 which is in an on state. At this time, the output terminal VOUT is connected not only to the capacitor C2, but also to the non-inverting input side of the first differential pair (gate of M6), so that positive feedback is partially applied.

During the period T03, the output terminal VOUT is connected to both the non-inverting input side of the differential pair (M5, M6), that is, the gate of M6, and the inverting input side of the differential pair (M3, M4), that is, the gate of M3, thus worsening the output accuracy.

In the configuration of FIG. 4, the capacitor C2 is provided for suppressing the effect of the noise accumulated in the capacitor. The capacitor C2 is charged with the output potential Vout, during the time period TC, to suppress the value of the input capacitance by the capacitor C2 from increasing. Moreover, during the period TC, the non-inverting input side (gate of M6) and the capacitor C2 are disconnected from each other by the switch S6 to provide for operational stability of the output voltage Vout to prevent the output accuracy from being lowered.

It should be noted in this connection that, in the above Patent Document 3, no discussions have been made as to the worsening of the output accuracy caused by connection of the non-inverting input terminal (gate of M6) to the output terminal VOUT, or as to the disconnection such as is made by the switch S6 in the present invention.

Third Example

The circuit configuration of a third example of the present invention will now be described in detail. FIG. 5 shows the configuration of a differential amplifier according to a third example of the present invention. Meanwhile, the configuration of FIG. 5 differs from that of FIG. 4 as to the manner of switch control. The configuration of the present example suppresses the input capacitance from increasing and improves the slew rate to provide for a shorter offset detection period.

Referring to FIG. 5, showing the differential amplifier of the present example, a differential pair (M5, M6), driven by a current source (transistor M8 supplied with VBIAS) and a differential pair (M3, M4), driven by a current source (M9), are connected in common to a load circuit. In FIG. 5, the specified load circuit is composed of a transistor M1, connected in a diode configuration, and a transistor M2, having a gate connected to a gate of M1.

The gate of one M5 of the transistors of the differential pair (M5, M6) is connected to an output terminal VOUT via switch S3. The gate of the other transistor M6 of the differential pair (M5, M6) is connected via switch S4 to the input terminal VIN. The gate of one M3 of the transistors of the differential pair (M3, M4) is connected to the output terminal VOUT via switch S2, while being connected via switch S1 to the input terminal VIN. The gate of the other transistor M4 of the differential pair (M3, M4) is directly connected to the input terminal VIN. A capacitor C1 is connected between the gate of the transistor M5 and a low potential power supply VSS via a switch S7 which is on for all time, whilst a capacitor C2 is connected between the gate of the transistor M6 and the low potential power supply VSS via a switch S6. The output terminal VOUT is also connected via switch S5 to C2. An amplifier stage 103 is connected between the output ends of the differential pairs (M5, M6) and (M3, M4), that is, a common drain end of the transistors M2 and M4, or PA, and the output terminal VOUT, or PB.

FIG. 6 shows an illustrative timing diagram for showing on/off control of the respective switches of the offset cancellation amplifier of FIG. 5 during one data output period, and specifically shows the manner of control for suppressing the input capacitance by the capacitor C2 from increasing. The input voltage Vin is changed each data output period, such that it is necessary to supply a sufficient amount of electric charge from the supply terminal VIN from the external power supply to the capacitor C2. The effective input capacitance may be decreased by exercising the control as shown in FIG. 2.

The operation of the offset cancellation amplifier of FIG. 5 by the control of FIG. 6 will now be described. In FIG. 6, each data output period is composed of an offset detection period TA and an offset cancellation period TB. The offset detection period TA is composed of an input capacitance reduction period TC and an offset charging/discharging period TD. Hence, the data output period is composed of three periods, namely the periods TC, TD and TB.

Initially, during the period TC, the switches S2, S3, S4 and S5 are turned on, while the switch S1 and S6 are turned off. The capacitor C2 is disconnected at this time from the gate of the transistor M6, and is connected to the output terminal VOUT via switch S5 which is in an on state. The input voltage Vin is supplied to the non-inverting input terminal of the differential pair (M5, M6), that is, to the gate of M6, while an output voltage Vout is fed back to the inverting input thereof, that is, to the gate of M5. The input voltage Vin is supplied to the non-inverting input terminal of the differential pair (M3, M4), that is, to the gate of M4, while the output voltage Vout is fed back to the inverting input terminal thereof, that is, to the gate of M5.

The output voltage Vout at this time is a voltage equal to the input voltage Vin as a reference plus the effect of variations in transistor characteristics, and hence is given by Vout=Vin+Vof.

Hence, the period TC is a preliminary driving period when the capacitor C2 is disconnected from the gate of the transistor M6 and the capacitors C1 and C2 are connected to the output terminal VOUT for preliminarily driving the potential of the capacitor to Vin+Vof.

Then, during the period TD, the switches S1, S3, S4 and S6 are turned on, while the switches S2 and S5 are turned off. The capacitor C2 is disconnected at this time from the output terminal VOUT and is connected via switch S6 in the on-state to the gate of the transistor M6, while being connected via switch S4 in the on-state to the input terminal VIN.

At this time, the voltage accumulated in the capacitor C2 is changed from (Vin+Vof) to Vin. This potential variance Vof of the capacitor C2, generated by electric charge supplied from VIN of the external supply terminal, is of a relatively small magnitude, so that only a small amount of electric charge supplied from outside suffices, thus allowing for suppression of the effective input capacitance.

Then, during the period TB, the switches S2 and S6 are turned on, while the switches S1, S3, S4 and S5 are turned off.

At this time, the voltages accumulated during the period TD, that is, Vin and Vin+Vof, are retained in the capacitors C2 and C1, respectively. Since the voltages retained by the capacitors are supplied to the inputs of the differential pair (M5, M6), the voltages equal to those during the period TD are supplied to these inputs. The input voltage Vin and the output voltage Vout are supplied to the non-inverting input terminal (gate of M4) and to the inverting input terminal (gate of M3) in the differential pair (M3, M4), respectively.

Meanwhile, the voltages applied to the input pair of the differential pair (M5, M6) remain unchanged throughout the periods TD and TB. Hence, the voltages applied to the differential pair (M3, M4) are kept in the same state as that during the period TD. Thus, during the period TB, Vout=Vin thus canceling the offset.

In the present example, feedback connection is applied to both the differential pairs (M5, M6) and (M3, M4), during the period TC, thus improving the slewing rate and setting the period TC to a shorter time period. Moreover, during the transition time from TC to TD, the output voltage Vout is varied by only a small voltage Vof, so that the period TD may also be set to a shorter time period and hence it is possible to provide for a shorter offset detection time.

Thus, in the offset cancellation amplifier of the third example, it is possible to suppress the effect of variations in transistor characteristics or the noise to supply a high accuracy voltage output. It is also possible, by providing the input capacitance reduction period TC for transient accumulation of the output voltage Vout in the capacitor C2, to suppress the input capacitance and the power consumption from increasing. Moreover, it is possible to provide for a shorter offset detection period by feedback with the two differential pairs.

FIGS. 7 and 8 show a modification of the offset cancellation amplifier shown in FIG. 5. The switch control and the circuit operation are similar to those of the circuit of FIG. 5. The difference of FIGS. 7 and 8 from FIG. 5 is solely the difference in the position of the switch S5. That is, in the case of FIG. 5, the capacitor C2 is charged (discharged) via switch S5 in an on state, during the input capacitance reduction period TC, whereas, in the case of FIG. 7, the capacitor C2 is charged (discharged) via switches S3 and S5 in an on state and also via switch S7 which is on for all time.

In the case of FIG. 8, the capacitor C2 is charged (discharged) via switches S2, S5 which are in an on state. The operation of FIGS. 7 and 8 is similar to that of FIG. 5.

Fourth Example

The circuit configuration of a fourth example of the present invention will now be described. FIG. 9 shows the configuration of a differential amplifier of the fourth example of the present invention. In the configuration shown in FIG. 9, in which the input capacitance is suppressed from increasing, a switch noise cancellation circuit is further provided for providing for supplying an output with still higher accuracy.

The configuration shown in FIG. 9 is a modification of the first example (FIG. 1). The configuration of FIG. 9 differs from FIG. 1 in further including switches S3B and S4B which take charge of the operation of cancellation of the switch noise. Although the switch control is the same as that of FIG. 2, the switches S3B and S4B are controlled by the signals which are reverse-phase signals of the control signals for the switches S3 and S4, respectively. That is, when the switches S3 and S4 are on, the switches S3B, S4B are off and, when the switches S3 and S4 are off, the switches S3B and S4B are on.

The switch noise will now be described by way of supplementary explanation. There are two main causes of noise, namely channel charge injection when switch is off and clock feed-through. The channel charge injection is a phenomena in which electric charge in the inversion layer of a transistor gets away towards the source and the drain when the switch turns off.

The clock feed-through is an error voltage caused by clock changes leaking to the sampling capacitance through a gate-drain or gate-source overlap capacitance of a transistor.

Suppose that, in an MOS switch, a signal VCLK at a gate input end of a transistor becomes off, and electric charge by channel charge injection is equally distributed to the source and to the drain. In this case, an error voltage $\Delta V$ due to channel charge injection may be represented by the following equation (1):

$$\Delta V = \frac{WLC_{OX}(V_{DD} - V_{in} - V_{TH})}{2C_H} \quad (1)$$

where W is a channel width, L is an input voltage, Vin is an input voltage, VTH is a threshold voltage of a transistor, CH is a capacitance sampling value and COX is a capacitance value per unit area of a gate oxide film.

The error voltage $\Delta V$ by the clock feed-through is represented by the following equation (2):

$$\Delta V = V_{CK} \frac{WLC_{OV}}{WC_{OV} + C_H} \quad (2)$$

where COV is overlap capacitance per gate unit area.

It is seen from the equations (1) and (2) that the sampling capacitance CH need to be enlarged to some extent to reduce the switch noise.

It is noted that the error voltage by channel charge injection is dependent on the input voltage Vin, while the error voltage due to clock feed-through is not dependent on the input voltage Vin.

The operation of the switches S3B and S4B, provided for canceling the above-described switch noise, will now be described as reference is also had to FIGS. 10A, 10B and 10C. FIG. 10A shows a switch circuit composed only of a PMOS transistor. FIG. 10B shows a switch circuit composed only of an NMOS transistor and FIG. 10C shows a switch circuit composed of a PMOS transistor and an NMOS transistor. The transistor M31 (or M41) is equivalent to the switch S3 and S4, while the transistor M32 (or M42) is equivalent to the switch S3B and S4B in FIG. 9.

During the offset detection period TA, the switches S3 and S4 are on, so that a preset potential is set in the capacitors C1 and C2. Using the symbols, shown in FIGS. 10A, 10B and 10C, switch control clocks φa and φb become HIGH and LOW, respectively, such that the drain-to-source current path of M31 (M41) becomes conductive.

Then, during the offset cancellation period TB, the switches S3 and S4 are in an off state, while the switches 3B and 4b are in an on state.

Using the symbols, shown in FIGS. 10A, 10B and 10C, switch control clocks φa and φb become LOW and HIGH, respectively, such that the drain-to-source current path of M31 (M41) becomes non-conductive. When M31 (M41) transition from conductive state to non-conductive state, channel charge of M31 (M41) is distributed to the source and to the source, while clocks are transmitted through capacitive coupling of the transistor, thus producing the switch noise.

However, electric charge is generated from M32 (M42) which is supplied with a reverse-phase clock signal, in a manner of counterbalancing the generation of charge caused by the switch noise, thus suppressing the switch noise. It is noted that the gate width of the transistor M32 (M42) is desirably one-half that of M31 (M41). Meanwhile, discussions on the cancellation of the switch noise may be found in the above-mentioned Non-Patent Document 1.

With the noise cancellation circuit, shown in FIGS. 10A, 10B and 10C, limitations are imposed on reducing the absolute value of the potential error caused by switch noise. Clock feed-through may be completely suppressed by halving the channel width. In channel charge injection, the channel charge is not necessarily equally distributed to the source and to the drain. It is difficult to model this charge distribution correctly. If the effect ascribable to the channel charge injection cannot be suppressed, input voltage dependent noise is sustained, thus giving rise ultimately to the offset of the offset cancellation amplifier.

In the circuit configuration, shown in FIG. 9, the potential accumulated in the capacitors C1 and C2 is supplied to the differential pair (M5, M6), after the absolute values of the switch noises of the switches S3 and S4, generated at the time of transitioning from the period TC to the period TD, are decreased by the operation of the switches S3B and S4B, such as to further suppress the switch noise.

Thus, with the offset cancellation amplifier, shown in the fourth example, it is possible to suppress the switch noise substantially completely and to suppress the effect of the noise or variations in transistor characteristics to provide for more accurate voltage output. Since the operation of the switches S3B and S4B enables more accurate output, the capacitance values of the capacitors C1 and C2 may be reduced to advantage in practical designing.

Fifth Example

The circuit configuration of a fifth example of the present invention will now be described. FIG. 11 shows the configuration of a differential amplifier according to a fifth example of the present invention. In the configuration of FIG. 11, the amplifier stage 103 of the first example (FIG. 1) is changed to an amplifier stage 104. In FIG. 11, the amplifier stage 104 is a differential amplifier stage having an input pair connected to one and the other common connection points of the output pairs of the first differential pair (M5, M6) and the second differential pair (M3, M4) and having an output terminal connected to VOUT. The operation of the amplifier stage 104 is the same as that of the amplifier stage 103.

Sixth Example

The circuit configuration of a sixth example of the present invention will now be described. FIG. 12 shows the configuration including an OP amplifier of FIG. 1 of the first example, and an OP amplifier opposite in polarity, unified together. The control of respective switches is as described with reference to FIG. 2.

Referring to FIG. 12, the differential amplifier of the sixth example includes NMOS differential pairs (M5, M6) and (M3, M4) and PMOS differential pairs (M25, M26) and (M23, M24). More specifically, the differential amplifier of the sixth example includes a PMOS load circuit (current mirror circuit composed of M1 and M2), connected in common to the differential pairs (M5, M6) and (M3, M4), and a current source for supplying the current to the differential pairs (M5, M6) and (M3, M4). The current source is made up by NMOS transistors M8, M9, the gate of which are supplied with VBIAS. The differential amplifier further includes an NMOS load circuit (current mirror circuit composed of M21 and M22), connected in common to the differential pairs (M25, M26) and (M23, M24), and a current source (PMOS transistors M28, M29 to the gates of which is supplied VBIAS2) for supplying the current to the differential pairs (M25, M26) and (M23, M24). The differential amplifier further includes an amplifier state 103, receiving a common output signal of the differential pairs (M5, M6) and (M3, M4), and an amplifier stage 203, receiving a common output signal of the differential pairs (M25, M26) and (M23, M24). The input pair (gates) of the differential pair (M5, M6) is connected to the input pair (gates) of the differential pair (M25, M26), while the input pair (gates) of the differential pair (M3, M4) is connected to the input pair (gates) of the differential pair (M23, M24). The connection of the capacitors C1 and C2 and the switches is as shown in FIG. 1. That is, the differential amplifier includes capacitors C1 and C2, having one ends connected to the power supply VSS, a switch S1, connected between the gate of the NMOS transistor M3 and VIN, and a switch S2, connected between the gate of the NMOS transistor M3 and VOUT. The differential amplifier also includes a switch S3, connected between the gate of the NMOS transistor M5 and VOUT, and a switch S4, connected between the reference voltage VREF and the gate of the NMOS transistor M6. The differential amplifier also includes a switch S5, connected between the other end of the capacitor C2 and VOUT, and a switch S6, connected between the other end of the capacitor C2 and the gate of the NMS transistor M6. The differential amplifier further includes a switch S7 connected between the other end of the capacitor C1 and the gate of the NMOS transistor M5.

In the present example, switch control shown in FIG. 2 is executed. During the first period TC of the data output period, the input terminal VIN is connected to one of differential inputs of the second and fourth differential pairs via switch S1 in an on state, the input terminal VIN is connected to the other of the differential inputs of the second and fourth differential pairs, the output terminal VOUT is connected to one of differential inputs of the first and third differential pairs via S3 in an on state, and the output terminal VOUT is connected to the other of the differential inputs of the first and third differential pairs via S4 in an on state. The ends of the capacitors C1 and C2, having the opposite ends connected to the low potential side electrode VSS, are connected via switches to the differential inputs of the first and third differential pairs, such as to accumulate the output voltage Vout in each of the capacitors C1 and C2.

During the second period TD, the switch S5 is turned off, while the switch S6 is in an on state. Since the connection to the capacitor C2 is changed over at this time from the output terminal VOUT to the reference voltage supply terminal VREF, the reference voltage Vref is accumulated in the capacitor C2 via switches S4 and S6 which are in an on states. Since Vout, that is, the voltage of (Vref+Vof), has been accumulated in the capacitor C2 during the period TC, charging (discharge) only of the offset voltage Vof for the capacitor C2 is sufficient during the period TD, so that it is possible to reduce the amount of electric charge to be supplied from an output terminal.

During the third period TB, the switches S1, S3, S4 and S5 are in an off state. At this time, the output terminal VOUT is connected via switch S2 in an on state to one of the second and fourth differential pairs, while the input terminal VIN is connected to the other differential pair.

It is noted that the voltage applied to the first and third differential pairs remains unchanged throughout the periods TD and TB. Hence, the state of the voltage applied to the second and fourth differential pairs is maintained in the same state as that during the period TD. Consequently, Vout=Vin during the period TB, thus canceling out the offset.

In FIG. 12, the input pairs of the first and second NMOS differential pairs and the third and fourth PMOS differential pairs are interconnected, and the input transistors are of two polarities. However, two capacitors C1 and C2 suffice. The load may be driven at high speed over a broad output voltage range based on a rail-to-rail configuration. Meanwhile, a connection stage, such as a floating current source, may be provided between the amplifier stages 103 and 104 to produce interaction.

Although the present invention has so far been described with reference to preferred examples, the present invention is not to be restricted to the examples. It is to be appreciated that those skilled in the art can change or modify the examples without departing from the scope and spirit of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An offset cancellation amplifier comprising:
   a differential stage that includes first and second differential pairs and a load circuit connected in common to output pairs of said first and second differential pairs;
   an amplifier stage that receives a common output signal of said first and second differential pairs and outputs an amplified signal to an output terminal of said offset cancellation amplifier;
   first and second capacitors; and
   a switch circuit that receives control signals and performs switching control of the connection of signals supplied to an input pair of said first differential pair and to an input pair of said second differential pair; wherein
   a data output period includes first to third periods in this order; said first capacitor being connected for all time during said data output period to one input of said input pair of said first differential pair;
   during said first period,
   the voltage at said output terminal is supplied to said one input of said input pair of said first differential pair;
   a reference voltage is supplied to the other input of said input pair of said first differential pair;
   the voltage at an input terminal of said offset cancellation amplifier is supplied in common to said input pair of said second differential pair; and
   the voltage at said output terminal is accumulated in common in said first and second capacitors with said second capacitor being disconnected from the other input of said input pair of said first differential pair;
   during said second period,
   the voltage at said output terminal is supplied to the one input of said input pair of said first differential pair;
   said reference voltage is supplied to the other input of said input pair of said first differential pair;
   the voltage at said input terminal is supplied in common to said input pair of said second differential pair;
   the voltage at said output terminal is accumulated in said first capacitor; and
   said second capacitor is disconnected from the voltage at said output terminal, connected to the other input of said input pair of said first differential pair and has said reference voltage accumulated therein; and wherein,
   during said third period,
   said input pair of said first differential pair is disconnected from the voltage at said output terminal and from said reference voltage;
   the voltage accumulated in said first capacitor is supplied to the one input of said input pair of said first differential pair;
   the voltage accumulated in said second capacitor is supplied to the other input of said input pair of said first differential pair;
   the voltage at said output terminal is supplied to the one input of said input pair of said second differential pair; and
   the voltage at said input terminal is supplied to the other input of said input pair of said second differential pair.

2. The offset cancellation amplifier according to claim 1, wherein
   said switch circuit includes:
   a first switch that controls the connection between the one input of said input pair of said second differential pair and said input terminal;
   a second switch that controls the connection between the one input of said input pair of said second differential pair and said output terminal;
   a third switch that controls the connection between the one input of said input pair of said first differential pair and said output terminal;
   a fourth switch that controls the connection between a supply terminal of said reference voltage and the other input of said input pair of said first differential pair;
   a fifth switch that controls the connection between said second capacitor and said output terminal; and
   a sixth switch that controls the connection between said second capacitor and the other input of said input pair of said first differential pair;
   wherein said first to sixth switches are on/off controlled by said control signals supplied to respective control terminals thereof.

3. The offset cancellation amplifier according to claim 2, wherein during said first period,
   said first, third, fourth and fifth switches are set in an on state and said second and sixth switches are set in an off state;
   during said second period,
   said first, third, fourth and sixth switches are set in an on state and said second and fifth switches are set in an off state; and
   during said third period,
   said first, third, fourth and fifth switches are set in an off state and said second and sixth switches are set in an on state.

4. The offset cancellation amplifier according to claim 1, wherein
   said switch circuit includes:
   a first switch that controls the connection between a first input of said input pair of said second differential pair and said input terminal;
   a second switch that controls the connection between the one input of said input pair of said second differential pair and said output terminal;

a third switch that controls the connection between the one input of said input pair of said first differential pair and said output terminal;

a fourth switch that controls the connection between a supply terminal of said reference voltage and the other input of said input pair of said first differential pair;

a fifth switch that controls the connection between a connection point of said first capacitor and the one input of said input pair of said first differential pair and said second capacitor; and a sixth switch that controls the connection between said second capacitor and the other input of said input pair of said first differential pair;

wherein said first to sixth switches are on/off controlled by said control signals supplied to respective control terminals thereof.

5. The offset cancellation amplifier according to claim 4, wherein during said first period, said first, third, fourth and fifth switches are set in an on state and said second and sixth switches are set in an off state;

during said second period, said first, third, fourth and sixth switches are set in an on state and said second and fifth switches are set in an off state; and during said third period, said first, third, fourth and fifth switches are set in an off state and said second and sixth switches are set in an on state.

6. The offset cancellation amplifier according to claim 1, wherein said reference voltage is constant during one data output period and is varied every data output period, and wherein the voltage accumulated in said second capacitor is varied every data output period.

7. The offset cancellation amplifier according to claim 1, wherein said reference voltage is made equal to a voltage at said input terminal.

8. An offset cancellation amplifier comprising:

a differential stage that includes first and second differential pairs and a load circuit connected in common to output pairs of said first and second differential pairs;

an amplifier stage that receives a common output signal of said first and second differential pairs and outputs an amplified signal to an output terminal of said offset cancellation amplifier;

first and second capacitors; and a switch circuit that receives control signals and performing switching control of connection of input signals supplied to an input pair of said first differential pair and to an input pair of said second differential pair;

wherein a data output period includes first to third periods in this order; said first capacitor being connected for all time during said data output period to one input of said input pair of said first differential pair;

during said first period, the voltage at said output terminal is supplied to the one input of said input pair of said first differential pair;

the voltage at an input terminal of said offset cancellation amplifier is supplied to the other input of said input pair of said first differential pair;

the voltage at said output terminal is supplied to one input of said input pair of said second differential pair;

the voltage at said input terminal is supplied to the other input of said input pair of said second differential pair; and the voltage at said output terminal is accumulated in common in said first and second capacitors as said second capacitor is disconnected from the other input of said input pair of said first differential pair;

during said second period, the voltage at said output terminal is supplied to said one input of said input pair of said first differential pair;

the voltage at said input terminal is supplied to the other input of said input pair of said first differential pair;

the voltage at said input terminal is supplied in common to said input pair of said second differential pair;

the voltage at said output terminal is accumulated in said first capacitor; and said second capacitor is disconnected from the voltage at said output terminal, connected to the other input of said input pair of said first differential pair and has the voltage at said input terminal accumulated therein; and wherein during said third period, said input pair of said first differential pair is disconnected from the voltage at said output terminal and the voltage at said input terminal;

the voltage accumulated in said first capacitor is supplied to one input of said input pair of said first differential pair;

the voltage accumulated in said second capacitor is supplied to the other input of said input pair of said first differential pair;

the voltage at said output terminal is supplied to the one input of said input pair of said second differential pair; and the voltage at said input terminal is supplied to the other input of said input pair of said second differential pair.

9. The offset cancellation amplifier according to claim 8, wherein said switch circuit includes:

a first switch that controls the connection between the one input of said input pair of said second differential pair and said input terminal;

a second switch that controls the connection between the one input of said input pair of said second differential pair and said output terminal;

a third switch that controls the connection between the one input of said input pair of said first differential pair and said output terminal;

a fourth switch that controls the connection between said input terminal and the other input of said input pair of said first differential pair;

a fifth switch that controls the connection between said second capacitor and said output terminal; and a sixth switch that controls the connection between said second capacitor and the other input of said input pair of said first differential pair;

wherein said first to sixth switches are on/off controlled by said control signal supplied to respective control terminals thereof.

10. The offset cancellation amplifier according to claim 8, wherein during said first period, said second, third, fourth and fifth switches are set in an on state and said first and sixth switches are set in an off state;

during said second period, said first, third, fourth and sixth switches are set in an on state and said second and fifth switches are set in an off state; and during said third period, said first, third, fourth and fifth switches are set in an off state and said second and sixth switches are set in an on state.

11. The offset cancellation amplifier according to claim 8, wherein said switch circuit includes:

a first switch that controls the connection between the one input of said input pair of said second differential pair and said input terminal;

a second switch that controls the connection between the one input of said input pair of said second differential pair and said output terminal;

a third switch that controls the connection between the one input of said input pair of said first differential pair and said output terminal;

a fourth switch that controls the connection between said input terminal and the other input of said input pair of said first differential pair;

a fifth switch that controls the connection between said first capacitor and one input of said input pair of said first differential pair and said second capacitor; and a sixth switch that controls the connection between said second capacitor and the other input of said input pair of said first differential pair;

said first to sixth switches being controlled to be turned on/off by said control signals supplied to respective control terminals thereof.

12. The offset cancellation amplifier according to claim 11, wherein during said first period, said second, third, fourth and fifth switches are set in an on state and said first and sixth switches are set in an off state;

during said second period, said first, third, fourth and sixth switches are set in an on state and said second and fifth switches are set in an off state; and during said third period, said first, third, fourth and fifth switches are set in an off state and said second and sixth switches are set in an on state.

13. The offset cancellation amplifier according to claim 8, wherein said switch circuit includes:

a first switch that controls the connection between the one input of said input pair of said second differential pair and said input terminal;

a second switch that controls the connection between the one input of said input pair of said second differential pair and said output terminal;

a third switch that controls the connection between the one input of said input pair of said first differential pair and said output terminal a fourth switch that controls the connection between said input terminal and the other input of said input pair of said first differential pair;

a fifth switch that controls the connection between the one input of said input pair of said second differential pair and said second capacitor; and a sixth switch that controls the connection between said second capacitor and the other input of said input pair of said first differential pair;

wherein said first to sixth switches are on/off controlled by said control signal supplied to respective control terminals thereof.

14. The offset cancellation amplifier according to claim 13, wherein during said first period, said first, third, fourth and fifth switches are set in an on state and said second and sixth switches are set in an off state;

during said second period, said first, third, fourth and sixth switches are set in an on state and said second and fifth switches are set in an off state; and during said third period, said first, third, fourth and fifth switches are set in an off state and said second and sixth switches are set in an on state.

15. The offset cancellation amplifier according to claim 2, further comprising:

a seventh switch that controls the connection between a connection point of the one input of said input pair of said first differential pair and said third switch and said first capacitor; said seventh switch being on for all time.

16. The offset cancellation amplifier according to claim 1, wherein said first and second capacitors are formed by the same fabrication process and are of the same capacitance value.

17. The offset cancellation amplifier according to claim 2, wherein the transistors constituting said third and fourth switches are of the same device size.

18. The offset cancellation amplifier according to claim 2, wherein a control signal controlling the on/off state of said third switch is the same signal as a control signal controlling the on/off state of said fourth switch.

19. The offset cancellation amplifier according to claim 2, wherein said third switch includes a first transistor the gate of which receives a first control signal;

said fourth switch includes a second transistor the gate, of which receives a second control signal; and said offset cancellation amplifier includes:

a third transistor connected between one input of said input pair of said first differential pair and said third switch, said third transistor being of the same conductivity type as said first transistor; and a fourth transistor connected between the other input of said input pair of said first differential pair and said fourth switch, said fourth transistor being of the same conductivity type as said second transistor;

said third transistor having a drain and a source short-circuited and having a gate supplied with an inverted signal of said first control signal;

said fourth transistor having a drain and a source short-circuited and having a gate supplied with an inverted signal of said second control signal.

20. The offset cancellation amplifier according to claim 1, wherein said amplifier stage is a differential amplifier circuit having an input pair connected to a connection point pair of an output pair of said first differential pair and an output pair of said second differential pair and having an output terminal connected to said output terminal.

21. The offset cancellation amplifier according to claim 1, further comprising:

third and fourth differential pairs different in polarity from said first and second differential pairs, another load circuit connected in common to said third and fourth differential pairs, and third and fourth current sources supplying currents to said third and fourth differential pairs; and another amplifier stage receiving a common output signal of said third and fourth differential pairs to output an amplified signal at an output terminal;

one input of said input pair of said first differential pair being connected to one input of said input pair of said third differential pair; the other input of said input pair of said first differential pair being connected to the other input of said input pair of said fourth differential pair;

one input of said input pair of said second differential pair being connected to one input of said input pair of said fourth differential pair; the other input of said input pair of said second differential pair being connected to the other input of said input pair of said fourth differential pair.

22. A method for controlling an offset cancellation amplifier, said offset cancellation amplifier including:

a differential stage including first and second differential pairs and a load circuit connected in common to output pairs of said first and second differential pairs;

an amplifier stage receiving a common output signal of said first and second differential pairs and outputting an amplified signal to an output terminal of said offset cancellation amplifier;

first and second capacitors;

said offset cancellation amplifier receiving control signals for switching control of connection of signal supplied to input pairs of said first and second differential pairs;

said first capacitor being connected to one input of said input pair of said first differential pair for all time during a data output period;

said data output period including first to third periods in this order;

said method comprising:

a step of exercising control so that, during said first period, the voltage at said output terminal is supplied to said one input of said input pair of said first differential pair;

a reference voltage is supplied to the other input of said input pair of said first differential pair;

the voltage at an input terminal of said offset cancellation amplifier is supplied in common to said input pair of said second differential pair; and the voltage at said output terminal is accumulated in common in said first and second capacitors with said second capacitor being disconnected from the other input of said input pair of said first differential pair;

a step of exercising control so that, during said second period, the voltage at said output terminal is supplied to the one input of said input pair of said first differential pair;

said reference voltage is supplied to the other input of said input pair of said first differential pair;

the voltage at said input terminal is supplied in common to said input pair of said second differential pair;

the voltage at said output terminal is accumulated in said first capacitor; and said second capacitor is disconnected from the voltage at said output terminal, connected to the other input of said input pair of said first differential pair and has said reference voltage accumulated therein; and a step of exercising control so that, during said third period, said input pair of said first differential pair is disconnected from the voltage at said output terminal and from said reference voltage;

the voltage accumulated in said first capacitor is supplied to the one input of said input pair of said first differential pair;

the voltage accumulated in said second capacitor is supplied to the other input of said input pair of said first differential pair;

the voltage at said output terminal is supplied to the one input of said input pair of said second differential pair; and the voltage at said input terminal is supplied to the other input of said input pair of said second differential pair.

23. A method for controlling an offset cancellation amplifier, said offset cancellation amplifier including:

a differential stage including first and second differential pairs and a load circuit connected in common to output pairs of said first and second differential pairs;

an amplifier stage receiving a common output signal of said first and second differential pairs and outputting an amplified signal to an output terminal of said offset cancellation amplifier;

first and second capacitors;

said offset cancellation amplifier receiving control signals for switching control of connection of signal supplied to input pairs of said first and second differential pairs;

said first capacitor being connected to one input of said input pair of said first differential pair for all time during a data output period;

said data output period including first to third periods in this order;

said method comprising:

a step of exercising control so that, during said first period, the voltage at said output terminal is supplied to the one input of said input pair of said first differential pair;

a voltage at an input terminal of said offset cancellation amplifier is supplied to the other input of said input pair of said first differential pair;

the voltage at said output terminal is supplied to an input of said input pair of said second differential pair;

the voltage at said input terminal is supplied to the other input of said input pair of said second differential pair;

the voltage at said output terminal being accumulated in common in said first and second capacitors with said second capacitor being disconnected from the other input of said input pair of said first differential pair;

a step of exercising control so that, during said second period, the voltage at said output terminal is supplied to said one input of said input pair of said first differential pair;

the voltage at said input terminal is supplied to the other input of said input pair of said first differential pair;

the voltage at said input terminal is supplied in common to said input pair of said second differential pair;

the voltage at said output terminal is accumulated in said first capacitor; said second capacitor is disconnected from the voltage at said output terminal, connected to the other input of said input pair of said first differential pair and has the voltage at said input terminal accumulated therein; and a step of exercising control so that, during said third period, said input pair of said first differential pair is disconnected from the voltage at said output terminal and from the voltage at said input terminal;

the voltage accumulated in said first capacitor is supplied to the one input of said input pair of said first differential pair;

the voltage accumulated in said second capacitor is supplied to the other input of said input pair of said first differential pair;

the voltage at said output terminal is supplied to the one input of said input pair of said second differential pair, and the voltage at said input terminal is supplied to the other input of said second differential pair.

24. A display apparatus including an amplifier circuit supplied with a grayscale voltage and adapted for driving a data line connected to a display device, wherein said amplifier circuit includes said offset cancellation amplifier according to claim 1.

* * * * *